United States Patent
Huynh et al.

(10) Patent No.: US 8,514,630 B2
(45) Date of Patent: Aug. 20, 2013

(54) DETECTION OF WORD-LINE LEAKAGE IN MEMORY ARRAYS: CURRENT BASED APPROACH

(75) Inventors: Jonathan H. Huynh, San Jose, CA (US); Feng Pan, Fremont, CA (US); Viswakiran Popuri, Milpitas, CA (US); Marco Cazzaniga, Palo Alto, CA (US)

(73) Assignee: SanDisk Technologies Inc., Plano, TX (US)

(*) Notice: Subject to any disclaimer, the term of this patent is extended or adjusted under 35 U.S.C. 154(b) by 86 days.

(21) Appl. No.: 13/016,732

(22) Filed: Jan. 28, 2011

(65) Prior Publication Data

US 2012/0008410 A1    Jan. 12, 2012

Related U.S. Application Data

(63) Continuation-in-part of application No. 12/833,146, filed on Jul. 9, 2010.

(51) Int. Cl.
*G11C 11/34* (2006.01)
(52) U.S. Cl.
USPC .................................................. 365/185.21
(58) Field of Classification Search
USPC .................................................. 365/185.21
See application file for complete search history.

(56) References Cited

U.S. PATENT DOCUMENTS

| | | | |
|---|---|---|---|
| 5,321,699 | A | 6/1994 | Endoh et al. |
| 5,335,198 | A | 8/1994 | Van Buskirk et al. |
| 5,386,422 | A | 1/1995 | Endoh et al. |
| 5,469,444 | A | 11/1995 | Endoh et al. |
| 5,602,789 | A | 2/1997 | Endoh et al. |
| 5,671,388 | A | 9/1997 | Hasbun et al. |
| 5,673,222 | A | 9/1997 | Fukumoto et al. |
| 5,822,256 | A | 10/1998 | Bauer et al. |
| 5,867,429 | A | 2/1999 | Chen et al. |
| 5,930,167 | A | 7/1999 | Lee et al. |

(Continued)

FOREIGN PATENT DOCUMENTS

| | | |
|---|---|---|
| EP | 2 261 806 A1 | 12/2010 |
| WO | WO 2007/016167 | 2/2007 |
| WO | WO 2009/050703 | 4/2009 |

OTHER PUBLICATIONS

U.S. Appl. No, 13/139,148 entitled "Data Recovery for Detection Word Lines During Programming of Non-Volatile Memory Arrays," filed Jul. 28, 2011, 48 pages.

(Continued)

*Primary Examiner* — Hoai V Ho
*Assistant Examiner* — Min Huang
(74) *Attorney, Agent, or Firm* — Davis Wright Tremaine LLP

(57) ABSTRACT

Techniques and corresponding circuitry are presented for the detection of wordline leakage in a memory array. In an exemplary embodiment, a capacitive voltage divider is used to translate the high voltage drop to low voltage drop that can be compared with a reference voltage to determine the voltage drop due to leakage. An on-chip self calibration method can help assure the accuracy of this technique for detecting leakage limit. In other embodiments, the current drawn by a reference array, where a high voltage is applied to the array with all wordlines non-selected, is compared to the current drawn by an array where the high voltage is applied and one or more selected wordlines. In these current based embodiments, the reference array can be a different array, or the same array as that one selected for testing.

24 Claims, 24 Drawing Sheets

(56) References Cited

U.S. PATENT DOCUMENTS

| | | | |
|---|---|---|---|
| 6,064,591 | A | 5/2000 | Takeuchi et al. |
| 6,134,140 | A | 10/2000 | Tanaka et al. |
| 6,185,709 | B1 | 2/2001 | Dreibelbis et al. |
| 6,205,055 | B1 | 3/2001 | Parker |
| 6,215,697 | B1 | 4/2001 | Lu et al. |
| 6,219,276 | B1 | 4/2001 | Parker |
| 6,219,286 | B1 | 4/2001 | Fuchigami et al. |
| 6,456,528 | B1 | 9/2002 | Chen |
| 6,560,143 | B2 | 5/2003 | Conley et al. |
| 6,625,061 | B2 | 9/2003 | Higuchi |
| 6,913,823 | B2 | 7/2005 | Pinton et al. |
| 6,914,823 | B2 | 7/2005 | Chen et al. |
| 6,917,542 | B2 | 7/2005 | Chen et al. |
| 6,917,543 | B2 | 7/2005 | Chen et al. |
| 7,009,889 | B2 | 3/2006 | Tran et al. |
| 7,158,421 | B2 | 1/2007 | Li et al. |
| 7,206,230 | B2 | 4/2007 | Li et al. |
| 7,376,011 | B2 | 5/2008 | Conley et al. |
| 7,428,180 | B2 | 9/2008 | Kim |
| 7,843,732 | B2 | 11/2010 | Lee et al. |
| 7,864,578 | B2 | 1/2011 | Takada |
| 7,864,588 | B2 | 1/2011 | Betser et al. |
| 7,969,235 | B2 | 6/2011 | Pan |
| 7,973,592 | B2 | 7/2011 | Pan |
| 8,027,195 | B2 | 9/2011 | Li et al. |
| 8,040,744 | B2 | 10/2011 | Gorobets et al. |
| 8,054,680 | B2 | 11/2011 | Matsuzaki et al. |
| 8,102,705 | B2 | 1/2012 | Lui et al. |
| 2001/0015932 | A1 | 8/2001 | Akaogi et al. |
| 2002/0007386 | A1 | 1/2002 | Martin et al. |
| 2003/0117851 | A1 | 6/2003 | Lee et al. |
| 2004/0022092 | A1 | 2/2004 | Dvir et al. |
| 2005/0160316 | A1 | 7/2005 | Shipton |
| 2006/0090112 | A1 | 4/2006 | Cochran et al. |
| 2006/0098505 | A1 | 5/2006 | Cho et al. |
| 2006/0239111 | A1 | 10/2006 | Shingo |
| 2007/0016167 | A1 | 2/2007 | Jun et al. |
| 2007/0171719 | A1 | 7/2007 | Hemink |
| 2007/0201274 | A1 | 8/2007 | Yu et al. |
| 2007/0234183 | A1 | 10/2007 | Hwang et al. |
| 2007/0296391 | A1* | 12/2007 | Bertin et al. ............... 323/303 |
| 2008/0062770 | A1 | 3/2008 | Tu Loc et al. |
| 2008/0177956 | A1 | 7/2008 | Peddle |
| 2008/0301532 | A1 | 12/2008 | Uchikawa et al. |
| 2009/0063918 | A1 | 3/2009 | Chen et al. |
| 2009/0073763 | A1 | 3/2009 | Hosono |
| 2009/0225607 | A1* | 9/2009 | Chen et al. ............. 365/189.07 |
| 2009/0228739 | A1 | 9/2009 | Cohen |
| 2009/0287874 | A1 | 11/2009 | Rogers et al. |
| 2009/0295434 | A1* | 12/2009 | Umeda et al. ............... 327/103 |
| 2009/0310423 | A1 | 12/2009 | Lo et al. |
| 2009/0316483 | A1 | 12/2009 | Kim et al. |
| 2010/0027336 | A1 | 2/2010 | Park et al. |
| 2010/0054019 | A1* | 3/2010 | Toda ........................... 365/148 |
| 2010/0070209 | A1* | 3/2010 | Sai ............................... 702/55 |
| 2010/0082881 | A1 | 4/2010 | Klein |
| 2010/0131809 | A1 | 5/2010 | Katz |
| 2010/0172179 | A1 | 7/2010 | Gorobets et al. |
| 2010/0172180 | A1 | 7/2010 | Paley et al. |
| 2010/0174845 | A1 | 7/2010 | Gorobets et al. |
| 2010/0174846 | A1 | 7/2010 | Paley et al. |
| 2010/0174847 | A1 | 7/2010 | Paley et al. |
| 2010/0309719 | A1 | 12/2010 | Li et al. |
| 2010/0309720 | A1 | 12/2010 | Liu et al. |
| 2011/0013457 | A1 | 1/2011 | Han |
| 2011/0035538 | A1 | 2/2011 | Kim et al. |
| 2011/0063918 | A1 | 3/2011 | Pei et al. |
| 2011/0066793 | A1 | 3/2011 | Burd |
| 2011/0096601 | A1 | 4/2011 | Gavens et al. |
| 2011/0099418 | A1 | 4/2011 | Chen |
| 2011/0099460 | A1 | 4/2011 | Dusija et al. |
| 2011/0145633 | A1 | 6/2011 | Dickens et al. |
| 2011/0148509 | A1 | 6/2011 | Pan |
| 2011/0286280 | A1 | 11/2011 | Kellam et al. |
| 2012/0008384 | A1 | 1/2012 | Li et al. |
| 2012/0008405 | A1 | 1/2012 | Shah et al. |
| 2012/0008410 | A1 | 1/2012 | Huynh et al. |

OTHER PUBLICATIONS

U.S. Appl. No. 13/280,217 entitled "Post-Write Read in Non-Volatile Memories Using Comparison of Data as Written in Binary and Multi-State Formats," filed Oct. 24, 2011, 110 pages.

U.S. Appl. No. 12/833,167 entitled "Detection of Broken Word-Lines in Memory Arrays," filed Jul. 9, 2010, 55 pages.

U.S. Appl. No. 12/833,146 entitled "Detection of Word-Line Leakage in Memory Arrays," filed Jul. 9, 2010, 57 pages.

U.S. Appl. No. 12/642,649 entitled "Data Transfer Flows for On-Chip Folding," filed Dec. 18, 2009, 73 pages.

U.S. Appl. No. 12/642,584 entitled "Maintaining Updates of Multi-Level Non-Volatile Memory in Binary Non-Volatile Memory," filed Dec. 18, 2009, 76 pages.

U.S. Appl. No. 12/642,740 entitled "Non-Volatile Memory and Method With Atomic Program Sequence and Write Abort Detection," filed Dec. 18, 2009, 63 pages.

U.S. Appl. No. 12/642,611 entitled "Non-Volatile Memory with Multi-Gear Control Using On-Chip Folding of Data," filed Dec. 18, 2009, 74 pages.

U.S. Appl. No. 13/332,780 entitled "Simultaneous Sensing of Multiple Wordlines and Detection of NAND Failures," filed Dec. 21, 2011, 121 pages.

U.S. Appl. No. 13/193,083 entitled "Non-Volatile Memory and Method with Accelerated Post-Write Read Using Combined Verification of Multiple Pages," filed Jul. 28, 2011, 100 pages.

U.S. Appl. No. 11/303,387 entitled "Charge Pump Regulation Control for Improved Power Efficiency," filed Dec. 16, 2011, 25 pages.

Notification of Transmittal of the International Search Report and the Written Opinion of the International Searching Authority, or the Declaration for International Application No. PCT/US2011/042382 mailed Oct. 6, 2011, 11 pages.

U.S. Appl. No. 13/101,765 entitled "Detection of Broken Word-Lines in Memory Arrays," filed May 5, 2011, 63 pages.

U.S. Appl. No. 61/495,053 entitled "Balanced Performance for On-Chip Folding on Non-Volatile Memories," filed Jun. 9, 2011, 86 pages.

U.S. Appl. No. 61/142,620 entitled "Balanced Performance for On-Chip Folding on Non-Volatile Memories," filed Jun. 9, 2011, 144 pages.

List of Pending Claims for International Application No. PCT/US2011/042382, filed Jun. 29, 2011, 8 pages.

* cited by examiner

Programming into Four States Represented by a 2-bit Code

DETECTION OF WORD-LINE LEAKAGE IN MEMORY ARRAYS: CURRENT BASED APPROACH

CROSS REFERENCE TO RELATED APPLICATIONS

This application is a continuation in part of U.S. patent application Ser. No. 12/833,146 filed on Jul. 9, 2010, and entitled "Detection of Word-Line Leakage in Memory Arrays", by Yan Li, Dana Lee, and Jonathan Huynh, which application is incorporated herein in its entirety by this reference.

FIELD OF THE INVENTION

This invention relates generally to semiconductor memory circuits such as electrically erasable programmable read-only memory (EEPROM) and flash EEPROM, and specifically to the detection of defective word-lines in such memory circuits.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash. EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Defects often occur in such memory systems, both as part of the manufacturing process as well over the operating life of the device. One of the sources of such defects are the word-lines of such memory arrays, due both to word-line leakage (to another work-line or to the substrate) and to broken word-lines. These word-line related problems typically become more and more acute as device sizes scale down. Some word-line to word-line leakage does not manifest itself when the device is fresh, but only results in a failure after the stress of a number of program-erase cycles. This leakage will cause the faulty word-line to fail to program and corresponding data will be corrupted. A broken word-line will have a high resistive connection, as a result of which the cells on far end of the break will see a voltage drop during program and verify operations. As a result, the threshold voltage distribution for the broken word-line will show un-distinguishable states. Consequently, both of these sorts of defects can be detrimental to memory operation if not detected.

SUMMARY OF INVENTION

According to a first set of aspects, a method is presented for determining whether one or more of the word-lines are defective in a memory circuit having memory cells of an array formed along word-lines. A voltage pattern is applied to a first plurality of the word-lines, which are allowed to charge up according to the applied voltage pattern. The resultant charge is then trapped on these word-lines. After a time delay, a comparison is performed between a voltage derived from the voltage level of the first plurality word-lines and a reference voltage. Based upon the comparison, it is determined whether at least one of the first plurality of word-lines is defective.

In other aspects, a memory device is presented. The memory device includes a memory array having memory cells formed along multiple word-lines, a voltage generation circuit to provide a first voltage level to an output node, and decoding circuitry, whereby the first voltage level from the output node can be selectively applied to the word-lines. The memory device also includes a word-line defect detection circuit. The word-line defect detection circuit includes: a capacitive voltage divider, which is connected between the output node and ground; a first switch, through which an intermediate node of the capacitive voltage divider is connected to receive a voltage derived from the first voltage level; and a comparator having a first input connected to the intermediate node of the capacitive voltage divider and a second input connected to receive a reference voltage. The memory device can perform a process for the detection of defective word-line that includes a pre-charge phase, a subsequent isolation phase, followed by a detection phase. In the pre-charge phase, the decoding circuitry connects the output node to apply the voltage level to a pattern of a first set of the word-lines and the first switch is closed. In the isolation phase the output node is left to float and the first switch is open. In the detection phase the first switch is open and the output of the comparator indicates the value of the voltage level on the intermediate node relative to the reference voltage.

In further aspects, a method of determining whether one or more of the word-lines are defective for a memory circuit having memory cells of one or more arrays formed along word-lines. The method includes applying a voltage to a first array while all of the word-line selection switches of are turned off and establishing a first current level, where the first current level is the level of current drawn by the first array while all of the word-line selection switches thereof are turned off. The method also includes applying the voltage to a second array while the word-line selection switches of a selected set of the word-lines of the second array are turned on and all of the other word-line selection switches for the second array are turned off and establishing a second current level, where the second current level is the level of current drawn by the second array while the word-line selection switches of the selected set of the word-lines of the second array are turned on and all of the other word-line selection switches for the second array are turned off. A comparison of the first and second current levels is performed and, based upon the comparison, determining whether the selected set of word-lines includes one or more defective word-lines.

Additional aspects relate to a memory device one or more arrays of memory cells formed along a plurality of word-lines. The memory device also includes a voltage generation circuit to provide a first voltage level to an output node and decoding circuitry, whereby the first voltage level from the output node can be selectively applied to the word-lines, including a corresponding selection switch for each of the individual word-lines and circuitry for supplying the first voltage level to all of the word-line selection switches of a selected array. The device also has word-line defect detection circuitry, including: current level detection circuitry connectable to the array to determine that amount of current drawn by a selected array when the first voltage is supplied to the word-line selection switches thereof, the word-line selection switches of a selected set of the word-lines of the selected array are turned on and all of the other word-line selection switches for the selected array are turned off; comparison circuitry to perform a comparison the current drawn by a first selected when all of the word-line selection switches there of are turned off and of a second selected array when the word-line select switches of a selected pattern of word-lines thereof are turned on; and logic circuitry to determine, based on the comparison, whether one or more of the word-lines of the selected pattern are defective.

Various aspects, advantages, features and embodiments of the present invention are included in the following description of exemplary examples thereof, whose description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications,

DETAILED DESCRIPTION OF THE PREFERRED EMBODIMENTS

Memory System

FIG. 1 to FIG. 11 illustrate example memory systems in which the various aspects of the present invention may be implemented.

Figure 1:
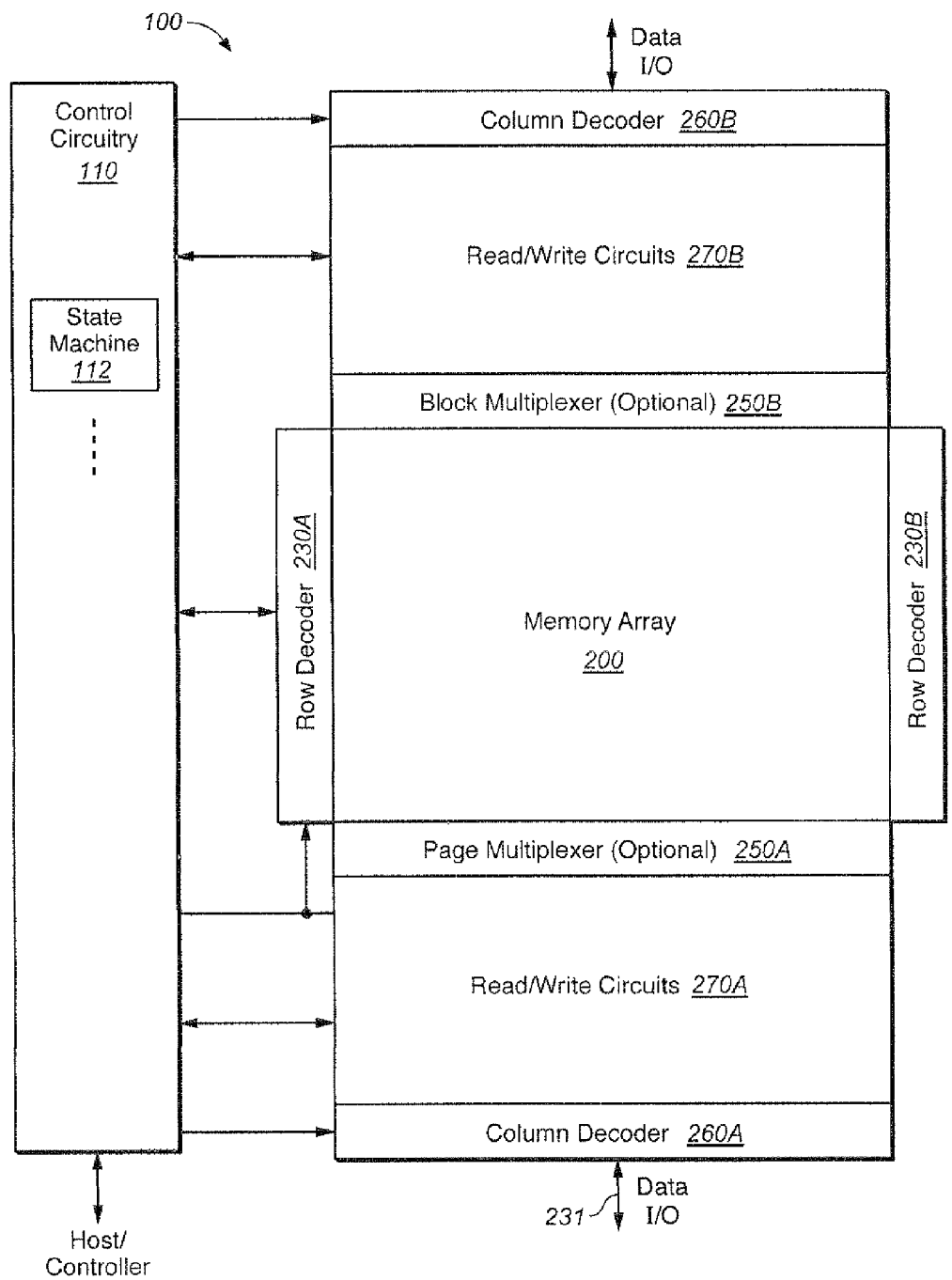
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
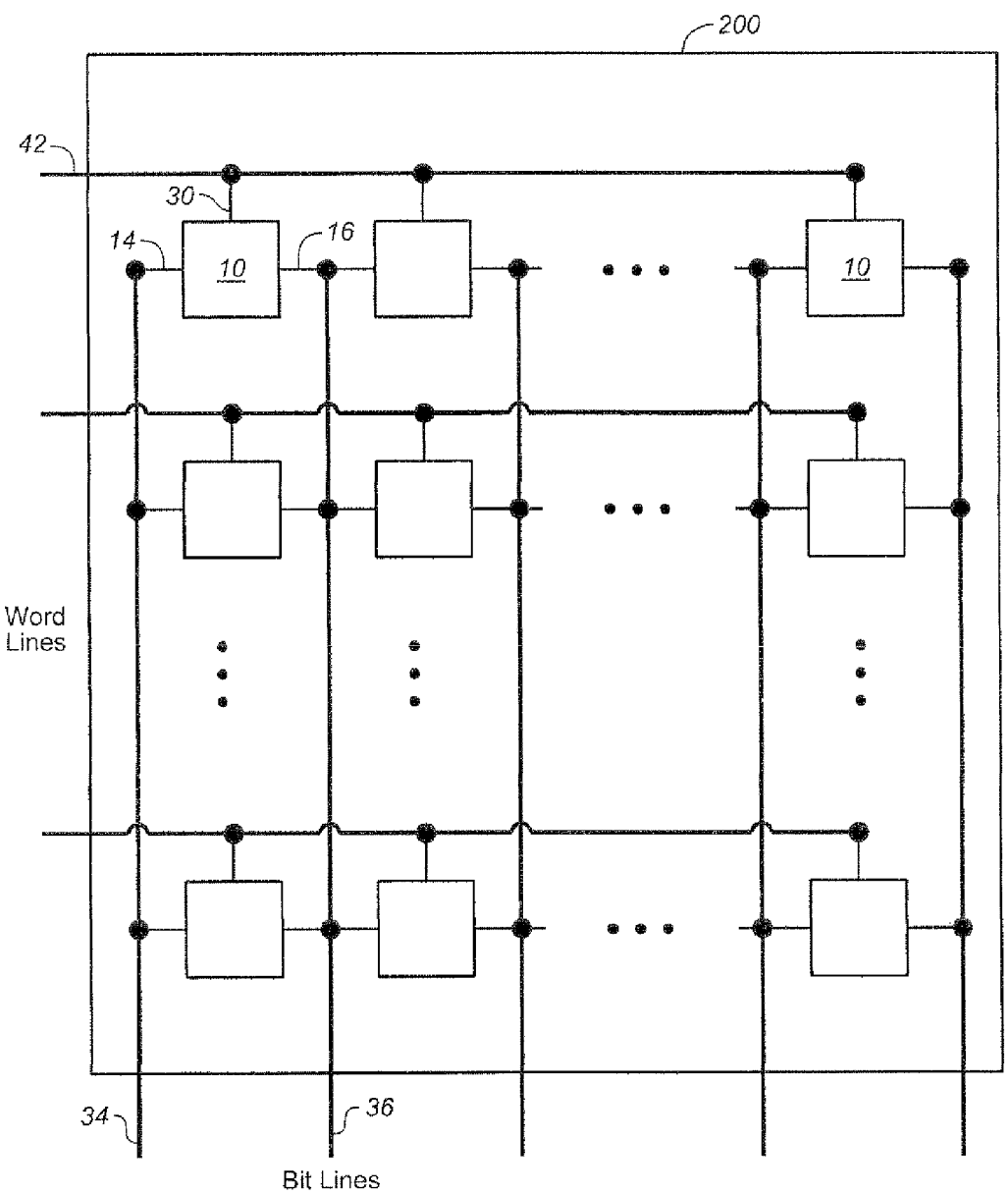
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
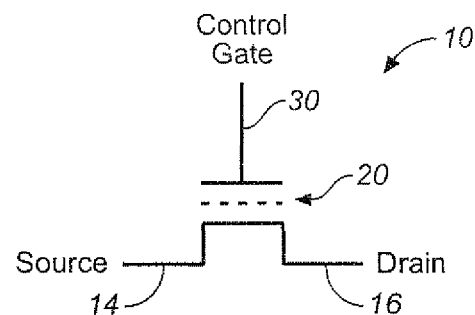
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
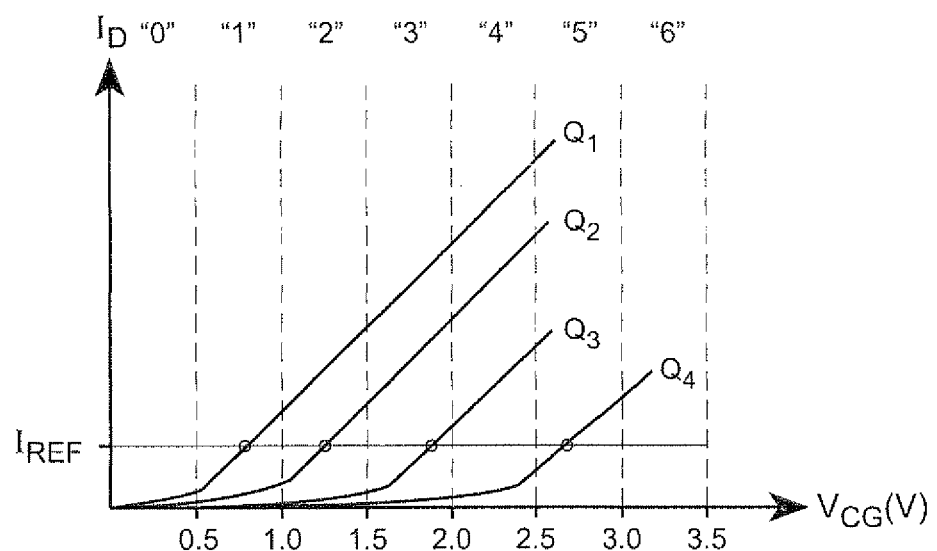
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
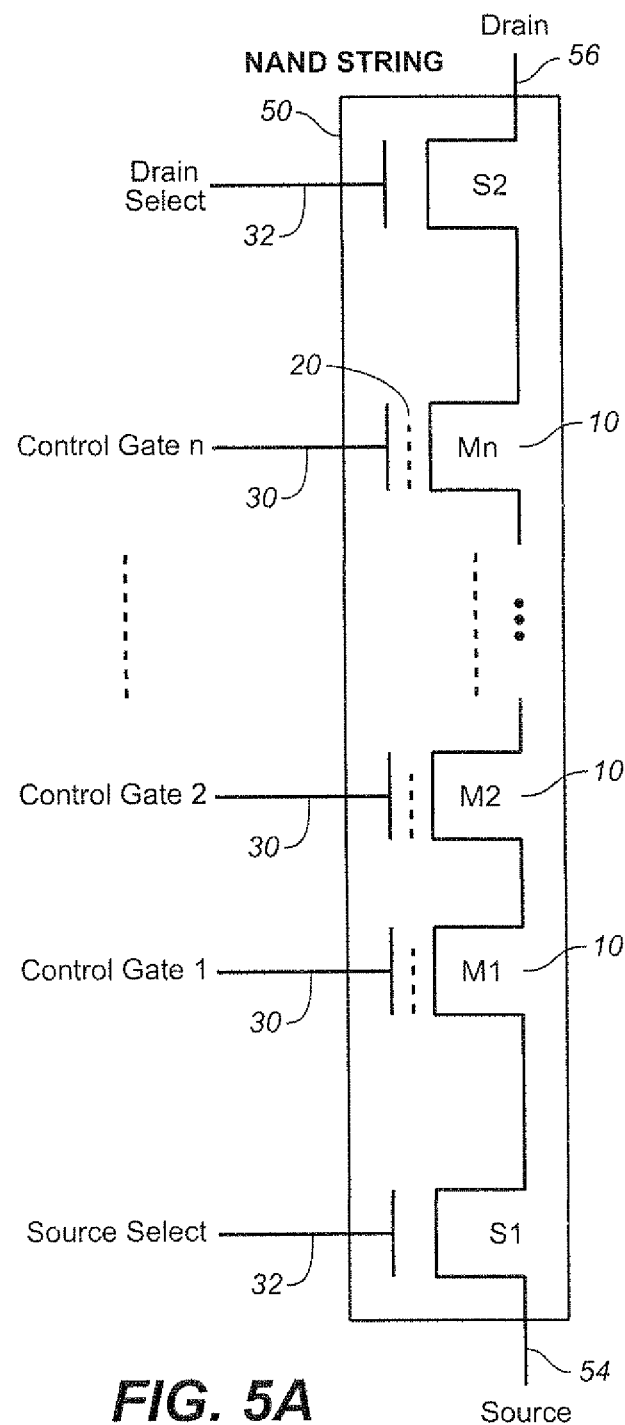
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
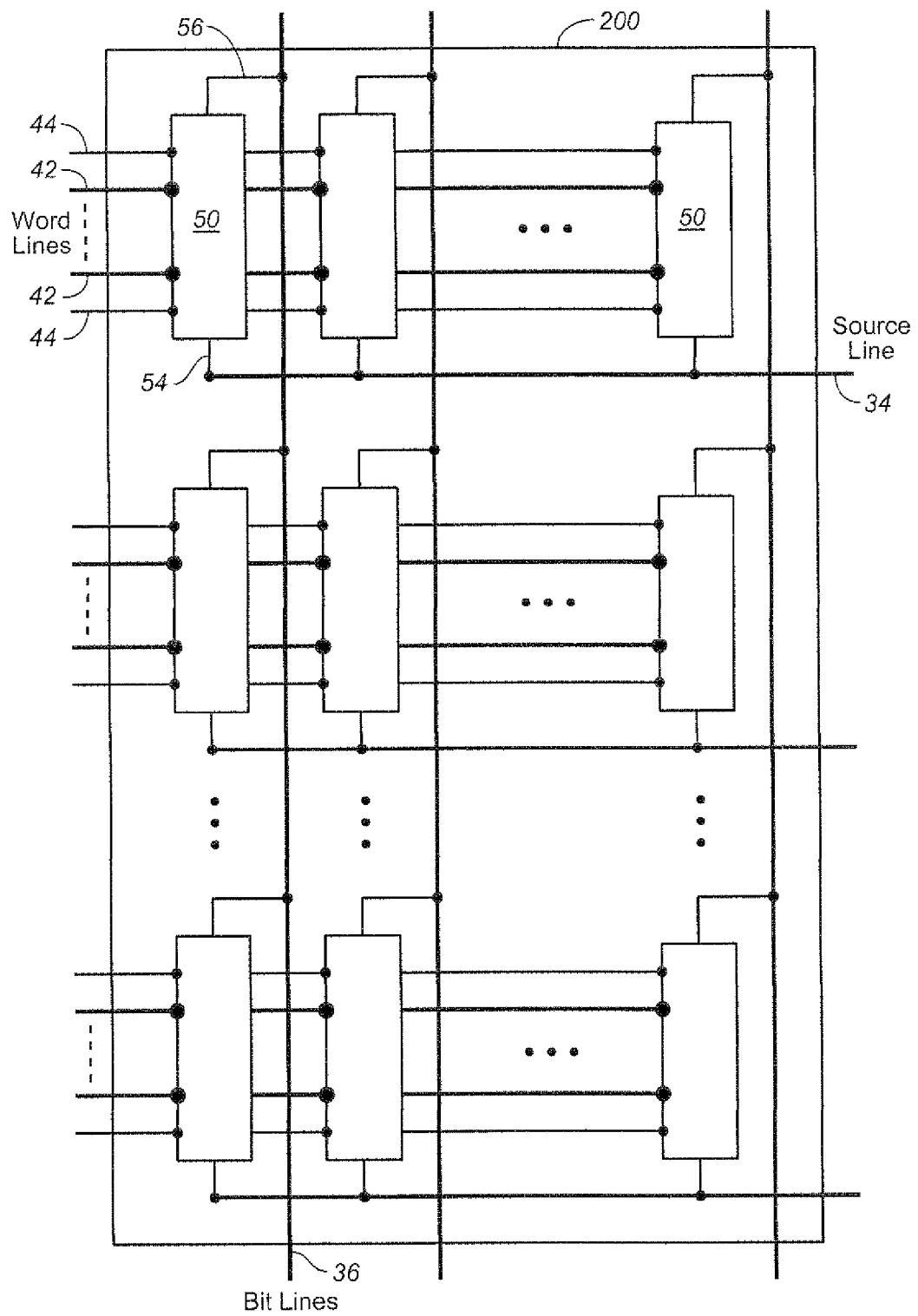
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
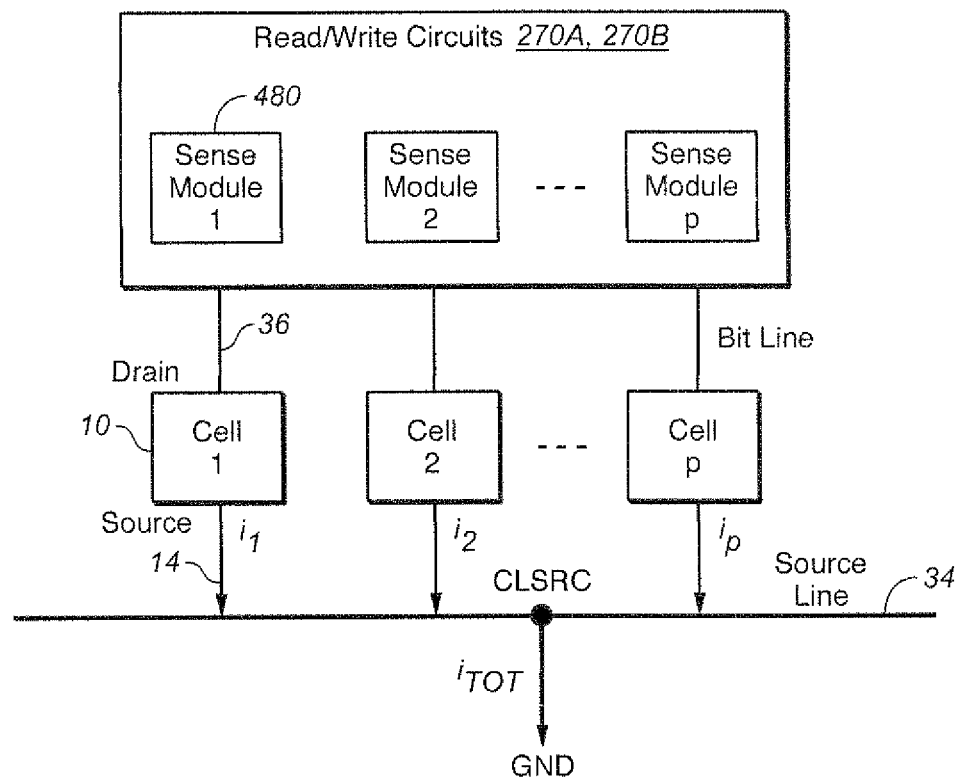
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit x4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
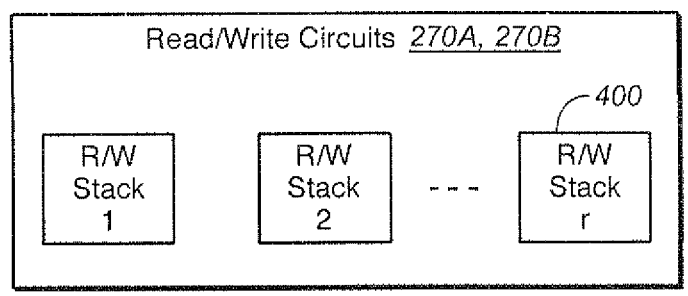
FIG. 7 illustrates schematically a preferred organization of the sense modules shown in FIG. 6.

FIG. 7 illustrates schematically a preferred organization of the sense, modules shown in FIG. 6. The read/write circuits 270A and 270B containing p sense modules are grouped into a bank of read/write stacks 400.

Figure 8:
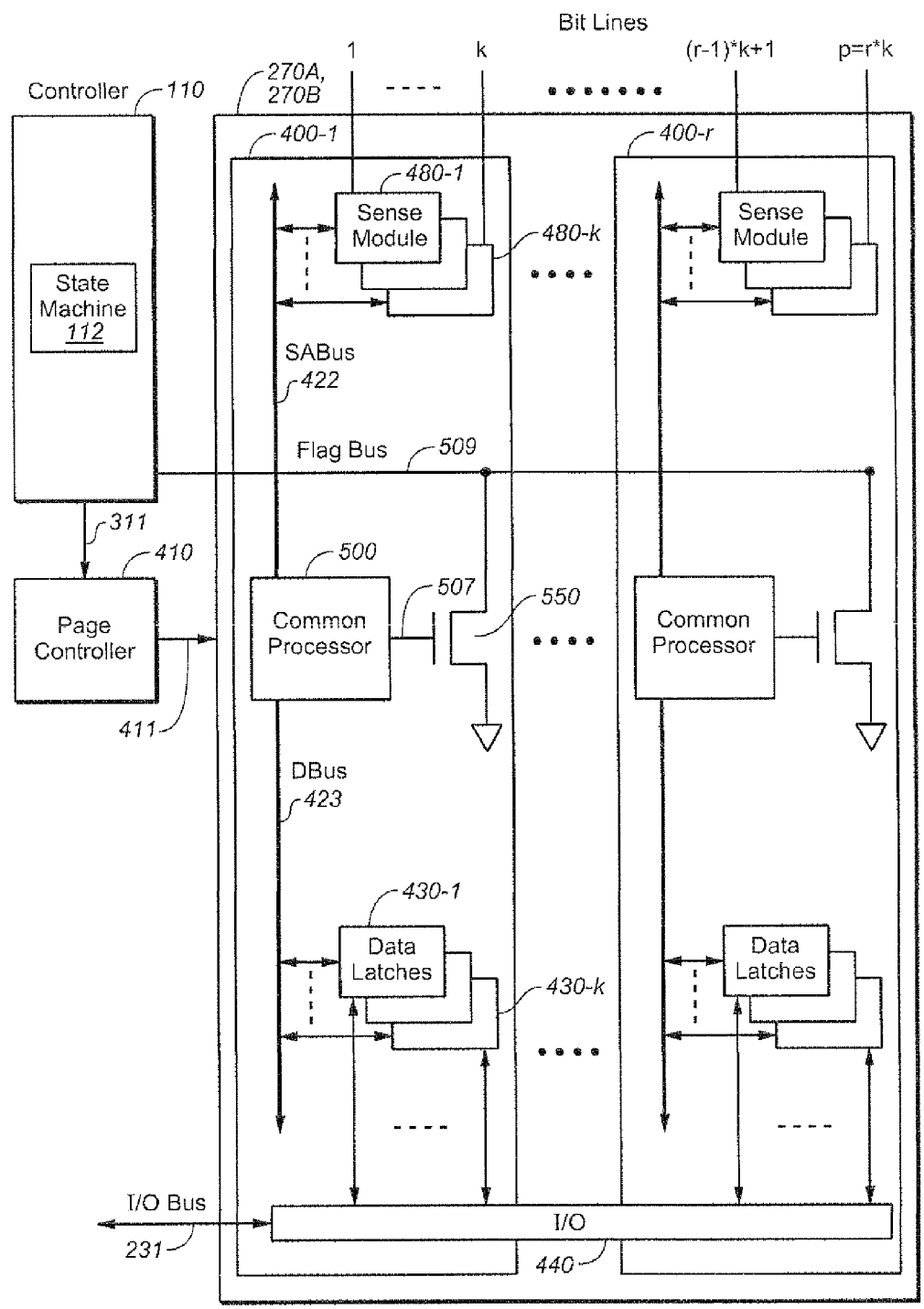
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, ..., 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack. The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Examples of Multi-state Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
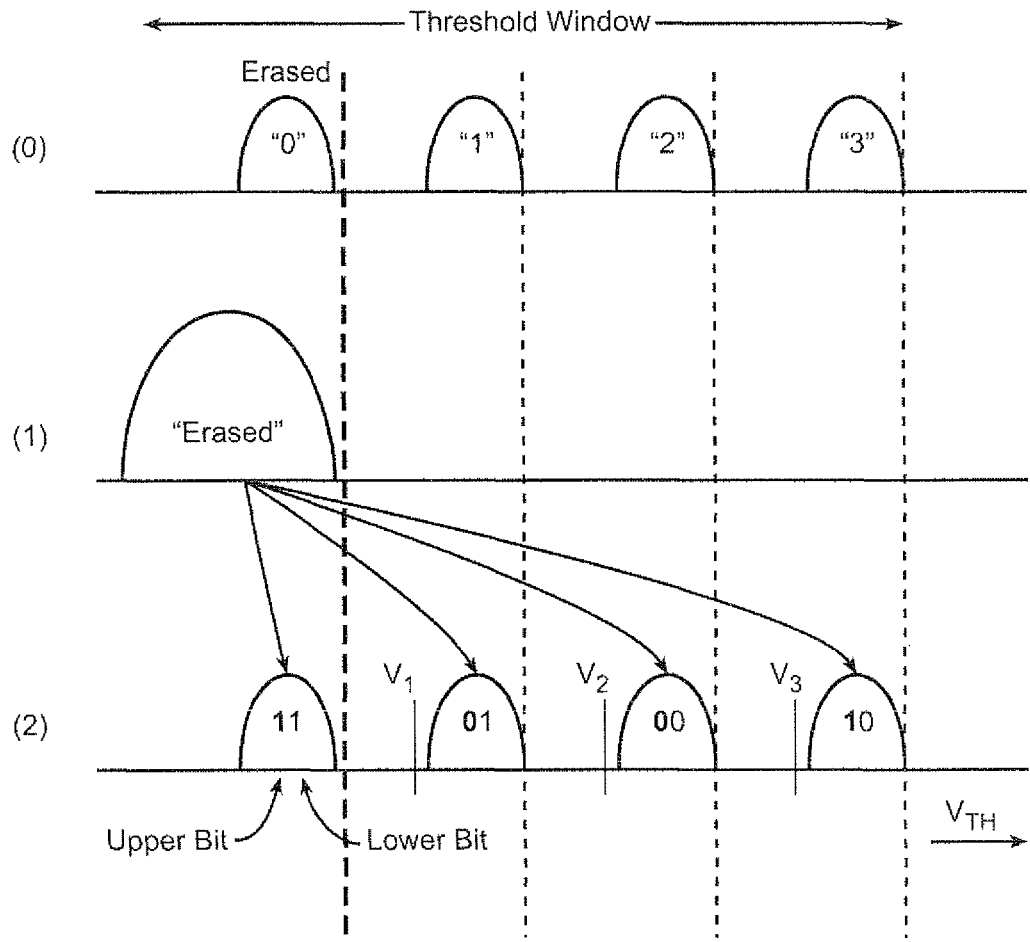
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $V_1$, $V_2$ and $V_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $V_1$, $V_2$ and $V_3$ in three subpasses respectively.

Figure 10:
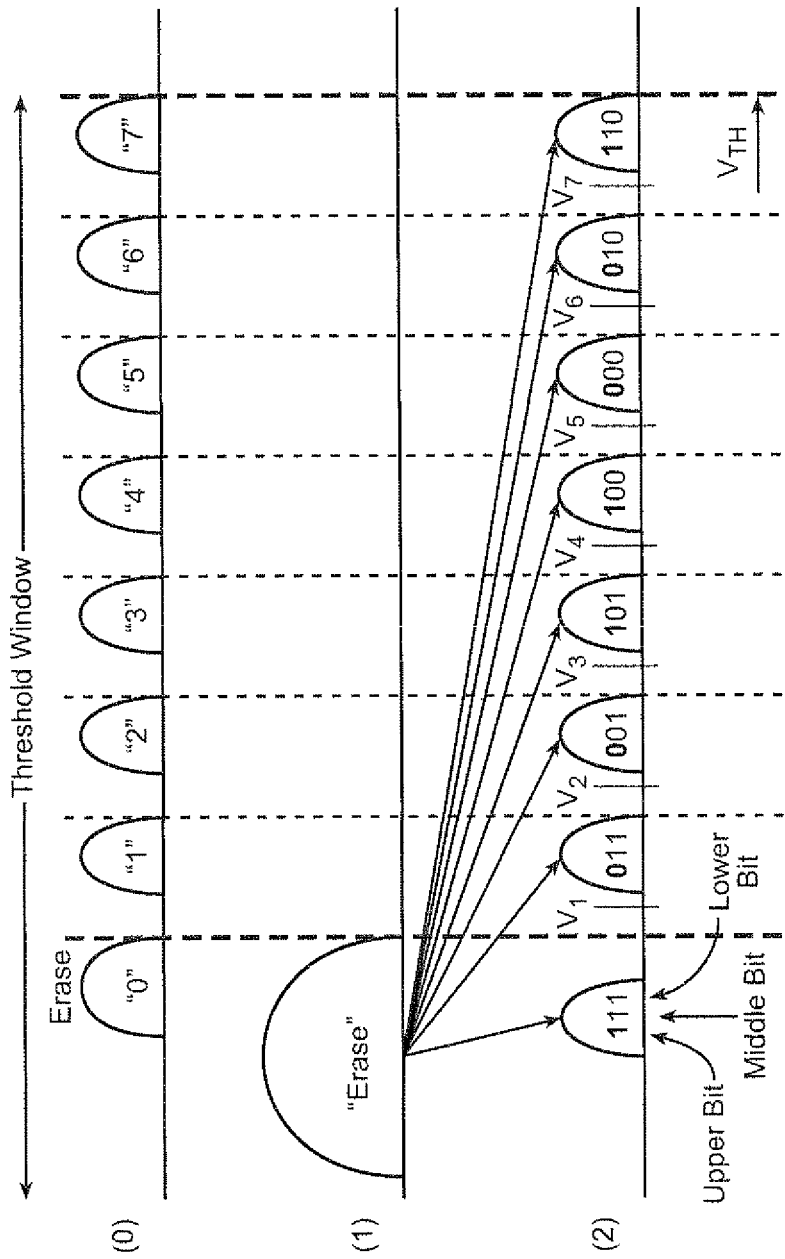
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $V_1$-$V_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101", "100", "000", "010" and "110". The 3-bit data may be read from the memory by sensing in "full-sequence" mode where the three bits are sensed together by sensing relative to the read demarcation threshold values $V_1$-$V_7$ in seven sub-passes respectively.

Page or Word-line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Since a verifying take place after a programming pulse and each verifying may be relative to a number of verify levels, various "smart" verifying schemes have been implemented to reduce the total number of verifying operations. For example, since the pulse by pulse programming increasing programs the population of cells towards higher and higher threshold levels, verifying relative to a higher verify level needs not start until a certain pulse. An example of a programming technique with smart verify is disclosed in U.S. Pat. No. 7,243,275, "SMART VERIFY FOR MULTI-STATE MEMORIES" by Gongwer et al., issued 10 Jul. 2007, and assigned to the same assignee as the present application. The entire disclosure of U.S. Pat. No. 7,243,275 is incorporated herein by reference.

Figure 11:
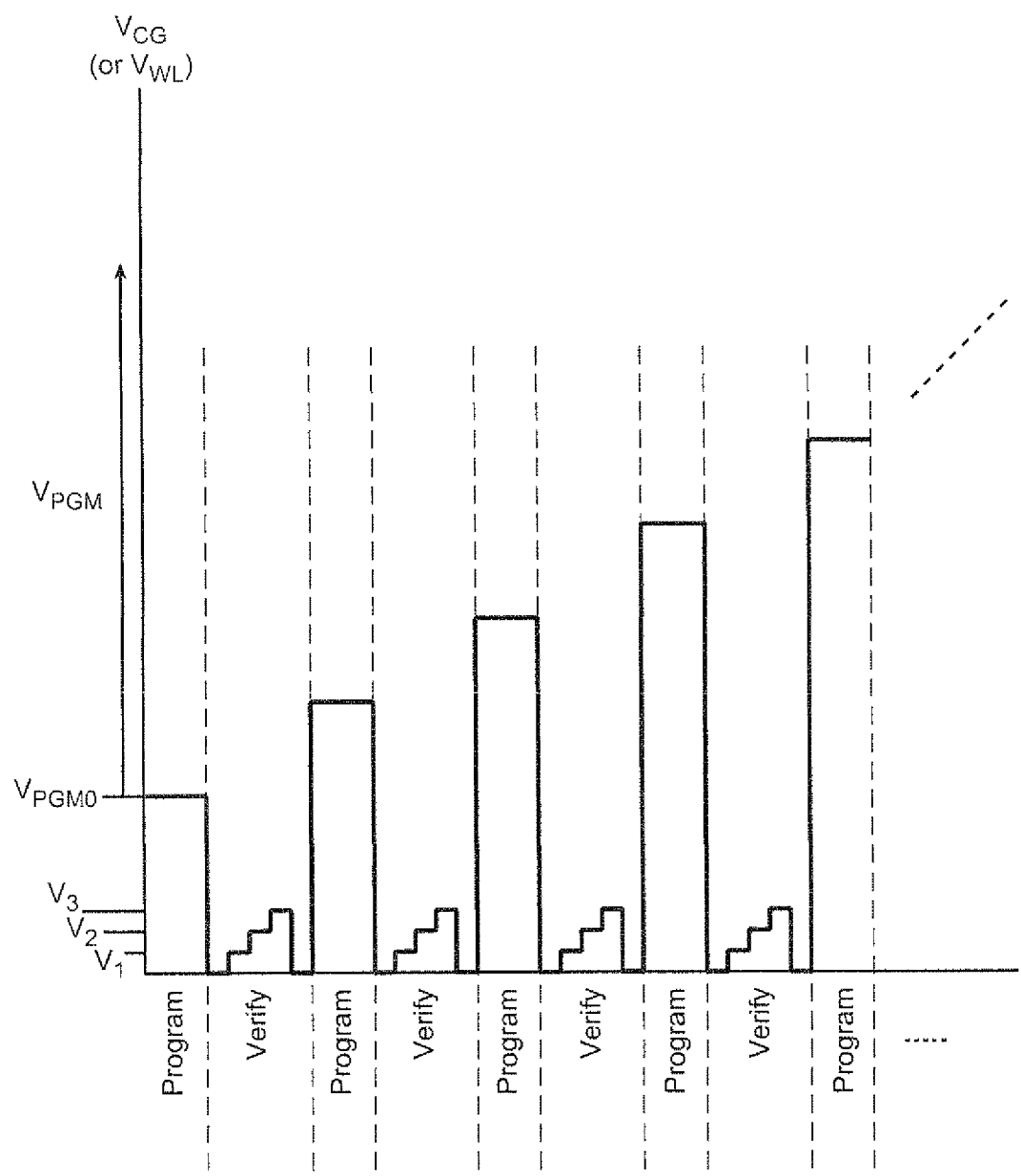
FIG. 11 illustrates a conventional technique for programming a 4-state memory cell to a target memory state.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PMG0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

Defective Word-Lines

The next sections will consider techniques for the identification of defective word-lines. As discussed in the Background, word-line defects can include both leaky word-lines and broken word-lines. Both of these are consider below, with word-line leakage discussed first.

Word-Line Leakage Detection

Under prior art arrangements, the detection of word-line leakage can typically only be done at test time for the memory chip by applying high voltage levels directly to a device's pins and then measuring the current/voltage levels at the pins. The requires the use of tester device and cannot be done after the memory chip is assembled as part of a device. This means that the word-lines cannot then be checked after device burn-in. The techniques presented here allow for an on-chip means of detecting word-line leakage.

As will be discussed in the following paragraphs, the techniques presented allow for the detection of leakage on a word-line while the word-line has a high voltage applied internally. In an exemplary embodiment, a capacitive voltage divider is used to translate the high voltage drop to low voltage drop that can be compared with a reference voltage to determine the voltage drop due to leakage. The next section will present a related on-chip self calibration method that can help assure the accuracy of this technique for detecting leakage limit. For both of these processes, the can be under the control of the devices state machine, belonging to a built-in self test to save on the expensive of an external test device. In this way, the leakage determination can be done in an on-chip, automatic process that does not need complicated test equipment and can be performed in the field after chip is packaged.

First, some discussion of the problem involved here is probably useful. There is an ongoing effect to reduce memory devices to ever smaller scales. As the technology scales down to 20 nm and 10 nm memory cells, for example, the distance between the word-lines are consequently 20 nm or 10 nm. Tolerances become more critical and the device is more prone to defects that can cause word-lines leak to the substrate or short to adjacent word lines. It has been found that leakage correlates with dies that fail cycling due to grown defects and that detectable leakage seems to precede actual program status failure.

Previous methods for detection of word-line leakage would force a high voltage on the word-line and measure current leakage from a test pin pad. (Some examples of prior leakage detection is discussed in U.S. Pat. No. 5,428,621.) Since the leakage test requires a very accurate current source, this test mode can only be done by a conventional tester. As manufactures would like to migrate most of the test operations onto an inexpensive tester, a new test flow would be useful to be able to implement on-chip means of detecting word-line leakage. This section presents a way to enable the word-line leakage test automatically and internal to flash memory, and in a way that can be done with various voltage biases and multiple stress topologies. The method can also be done in the field after chip being packaged and further allow to system detect different leakage levels:

For a typical device, the word-line leakage could be on the order 100 nA at high voltage stress such as 10 to 20 Volts. The difficulty of detecting such a small current at high voltage is due to the current NAND architecture. This can be illustrated with FIG. 12. The planes of a memory circuit can have on the order of several thousand blocks, one of which is shown at 610 and each block may have several dozen word-lines, three of which are explicitly shown as WLn−1 615, WLn 613, and WLn+1 611. The high voltage is normally applied on the selected word-line, such as WLn 613 during program and read operations. The NAND architecture also requires to have the least area penalty of the wordline voltage drivers. The driver is typically connected to the wordlines from one end of the wordline array. If the architecture allow the connection to wordlines from both ends, wordline leakage or breakage can be detected by sending a known current from one end and detect the same current from the other end.

The high voltage VPGM is generated by a pump (discussed below with respect to FIG. 13) and supplied to the first decoding CGN block 601, represented here as a switch. CGN block 601 is a block to supplied the various (typically 3 to 5 different kinds) of voltages according to the mode of operations for each global control gate (CG) lines. Three of the CG lines (621, 623, 625) are shown explicitly, corresponding the shown word-lines. The CG lines (as many as the number of word-lines in each block) will rout to the row (block) decoder of the memory array. As indicated by the ellipses, the CG lines run to the other blocks of the array in addition to the only shown block of 610, so that these CG lines usually route with the top metal layer and run through all the row decoders of all planes. In one preferred embodiment, each block is decoded with a local pump. When the block is selected, a logic signal will enable the local pump to apply a high passing voltage transferG on the gates of the passing transistors (here represented by 631, 633, and 635 for the three shown word-lines) in the row decoder. The high voltage on the correspond global CG will be transferred to the word-line of the selected block. Here, only the word-line WLn 613 is shown connected to receive VPGM, with the two adjoining word-lines (611, 615) taken to ground (or more generally the low voltage level), corresponding to the word-line to word-line leakage test pattern discussed below.

Figure 12:
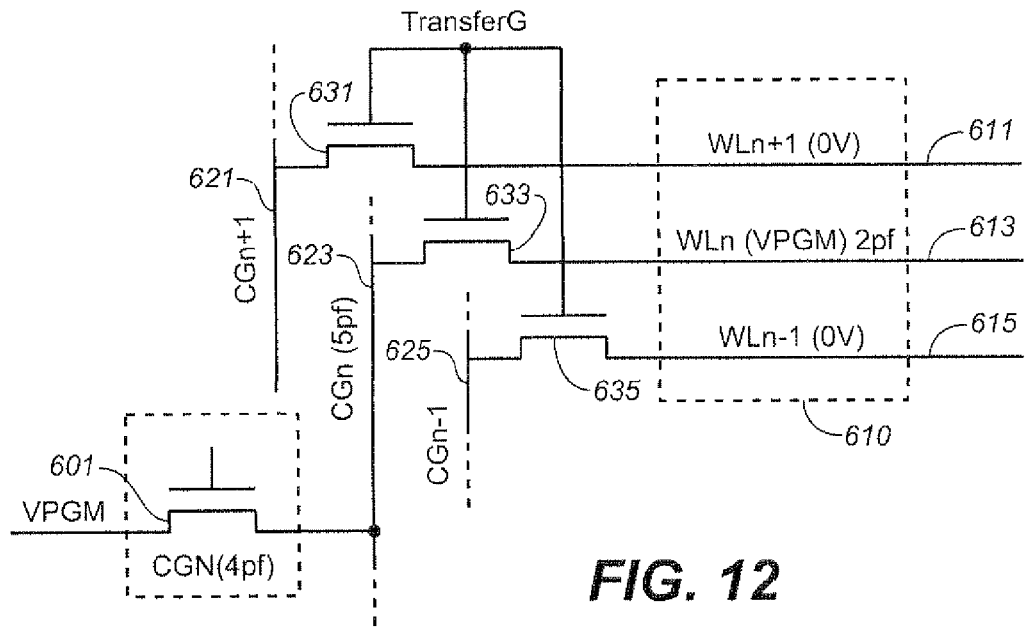
FIG. 12 shows a circuitry detail on how voltages are supplied to word-lines.

During the word-line leakage test, the word-lines can have different bias topology according to the defects to be detected. In the case of detecting word-line to substrate short, all the word-lines can be biased to high voltage of same levels, with the substrate at ground. In the case of detecting word-line to neighbor word-line shorts, the word-lines in the block will be biased alternatively at high voltage (VPGM) and 0 volts, as shown in FIG. 12. The worst parasitic capacitance will be from the latter case.

FIG. 12 also shows some exemplary, estimated values for the parasitic capacitances involved. From the high voltage pump to the CON (high voltage to multiplexing block) in a 64 word-line architecture the contribution is roughly 5 pF. Inside the CGN block, the loading will be 4 pF. Each global top metal routing from CGN block to the row decoder at the edge of the memory array is 4 pF. The junction capacitance of one plane is 1 pF. Each local word-line has 2 pF.

In the alternative bias configuration, with a total of 64 wordlines, of which 32 wordlines are biased to a high voltage while the other 32 wordlines are biased to 0V, such as shown in FIG. 12, the total word-line capacitance is 2×32=64 pF. The total global. CG line will be 5×32=160 pF. To detect the leakage on the high voltage supply node VPGM, then the total capacitance will be 64+160+4+5=233 pF.

Were the system to use 100 nA of leakage to discharge the large capacitance of 233 pF and let the high voltage to drop 1 volt, this will need a wait of 2.3 ms. After detecting the leakage on even word-line, the odd word-line will be tested with another 2.3 ms. The total leakage test time is around 5 ms.

To reduce the detection time, the voltage drop required for the detection can be reduced to 100 mV, with the corresponding detection time reduced to around 500 us. This can be used for in-field detection operations. In one preferred set of embodiments, this could be executed before each erase operation. For example, the detection can either be included as part of the erase operation sequence or can be done before the erase in response to an instruction issued by the controller. If a block fails, the controller can then remove it from the pool of usable blocks.

The discharge and testing time will depend on the parasitic capacitance of the CG routing. Because of this, one set of preferred embodiments has an on-chip calibration mechanism built in to memory chip so that the precise leakage criteria can be used for detection and the test time can be automatically adjusted according to the chip architecture, word-line voltage stress topology, number of planes, and any other contributing factors. This calibration system is discussed further in the next section.

Figure 13:
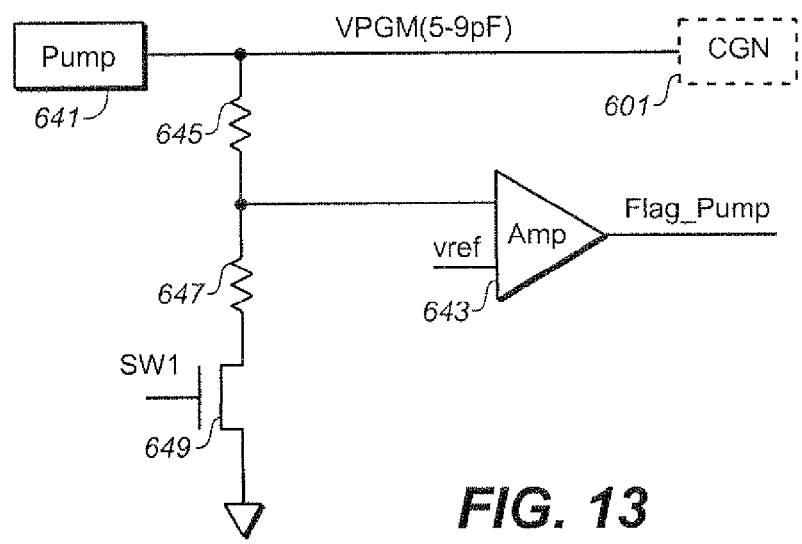
FIG. 13 is a block diagram of an exemplary charge pump circuit.

A normal high voltage pump is normally regulated by a resistor divider, such as shown in FIG. 13. The high voltage VPGM will be divided by the resistors 645 and 647, connected to ground (or more generally the low voltage level) through the switch SW1 649, and the compare point voltage for the amp 643 will be voltage reference vref of usually around 1.2 volts. The resistor chain normally will have a leakage current of 10 uA level. The differential amplifier or comparator 643 will be used to output a digital voltage flag_pump which will be used to control the pump clock. When the pump is pumped to the target level, the flag_pump will be low to turn off the pump clock. When the high voltage is dropped below certain level, the flag_pump signal will go high to enable the pump clock and turn on the pump to supply high voltage.

More detail on charge pumps can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; and 7,135,910; US Patent Publication numbers 2009-0153230-A1; 2009-0153232-A1; and 2009-0058506-A1; and application Ser. No. 11/295,906 filed on Dec. 6, 2005; Ser. No. 11/303,387 filed on Dec. 16, 2005; Ser. No. 11/845,939, filed Aug. 28, 2007; Ser. No. 12/144,808 filed on Jun. 24, 2008; Ser. No. 12/135,948 filed Jun. 9, 2008; Ser. No. 12/146,243 filed Jun. 25, 2008; Ser. No. 12/337,050 filed Dec. 17, 2008; Ser. No. 12/506,998 filed on Jul. 21, 2009; Ser. No. 12/570,646 filed on Sep. 30, 2009; and Ser. No. 12/640,820 filed on Dec. 17, 2009. In particular, U.S. Pat. No. 7,554,311 describes a regulation scheme that also employs capacitances in a voltage divider for regulation.

A detection principle similar to FIG. 12 can be used to detect the voltage change on the large parasitic high voltage node. Since the leakage is in the order of 100 nA, a new way to divide the high voltage to low voltage has to be used. A comparator is normally built with a low voltage supply for saving Icc current. A capacitive divider has the advantage of no leakage current.

Figure 14:
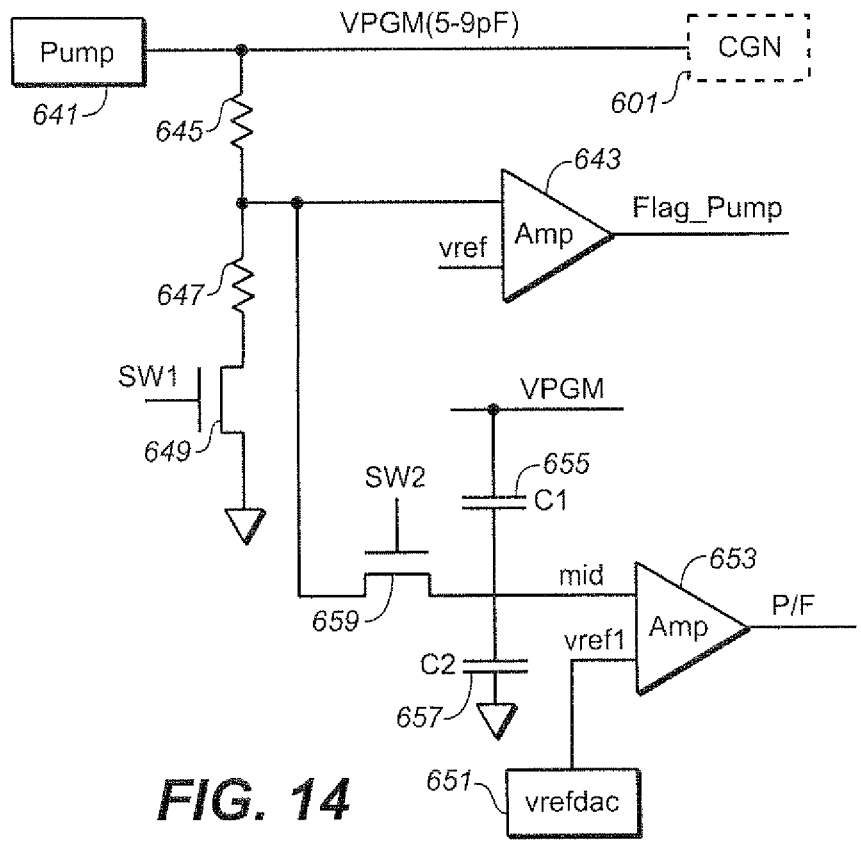
FIG. 14 adds leakage detection circuitry to FIG. 13.

The difficulty with a capacitive voltage divider is that the initial voltage at the detecting point has to be accurately set. As shown in FIG. 14, a new set of differential amplifiers or comparators 653 is added for the word-line leakage detection on top of that of regulator 643. The comparison voltage verf1 can be set by a digital to analog converter voltage circuit 651, whose input can be set according to the device. (In an alternate embodiment, this could also be set as part of the calibration process.) A switch transistor SW2 659 will be used to initialize the compare nodes at the same voltage level of the regulating level. The capacitors C1 655 and C2 657 are the capacitive voltage divider. A ratio is 1:1 can be used. The detection point voltage Vmid will have a delta of $$\Delta Vmid = \Delta V_{output}\left(\frac{C_1}{C_1 + C_2}\right)$$

where $\Delta V_{output}$ is the high voltage drop due to leakage.

To be able to detect the high voltage change of 100 mV, if the C1=C2, then a 50 mV change will be shown at the comparator point. The reference voltage for the comparator will be moved down by 50 mV. If the comparator also has accuracy problems, then the minimum detectable voltage drop will be limited by the comparator. The on-chip calibration can also correct some of the offset and error of the comparator.

Figure 15:
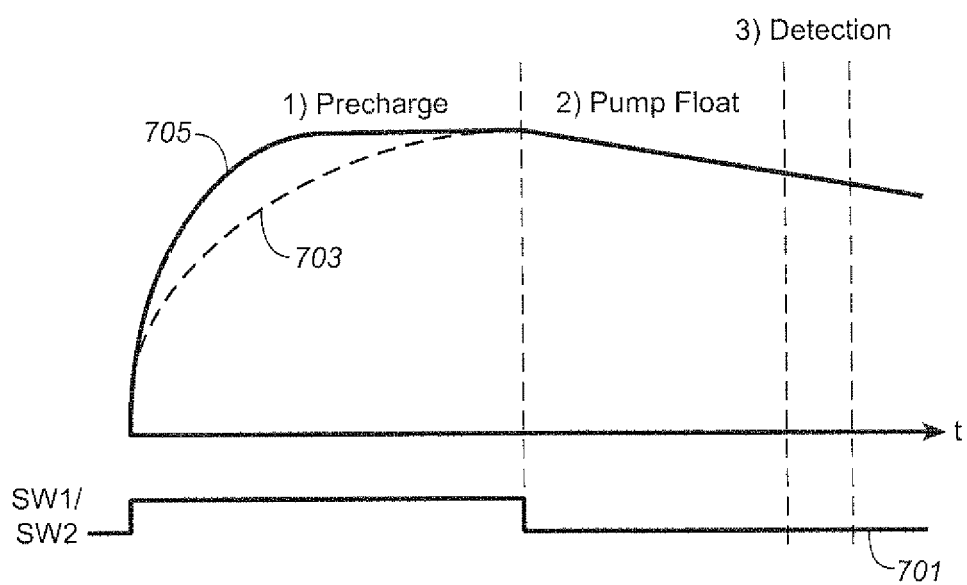
FIG. 15 illustrates the phases of the exemplary leakage detection operation.

The word-line leakage detection is a 3 step detection process, as shown in FIG. 15 where the level on the word-line is shown at 705. In a precharge phase, the word-lines are precharged to the high voltage level where the pump is on with regulator setting to targeted level SW1=vdd. Enough time should be used to charge the whole word-line. The far side of word-line which located far from the word-line driver side may take a longer time to charge (as shown as the dotted line 707). The high voltage can also pumped in two stages: first pumped to a intermediate voltage with another stronger pump, then use the high voltage pump to charge the word-line to a higher level. During the precharge time, the detection point Vmid is also initialized by turning on SW2.

After the word-line is fully charged to the target level, the pump will be turned off (float), along with the resistor regulator (SW1=0). The SW2 is also turned off, trapping a voltage on the mid node.

After some discharge time (a timer can be set with a parameter), the voltage drop will be measured by the comparator 653. The discharge time will depend on the total parasitic capacitance and the targeted detecting leakage current. (For more accurate leakage detection, a self calibration circuits will be introduced in the next section.) The mid point voltage will be compared with the vref1 to generate the signal Pass or Fail (P/F). The vref1 voltage is generated from an analog voltage generator 651 which can deliver a voltage between 0 to 1.2 V with 50 mV resolution, as an example.

When word-line leakage is detected, the whole block will typically be marked as a bad block which will not be used. Any valid data could be transferred as needed to another block, although, as noted above, in a preferred set of embodiments the leakage detection process is executed as part of an erase process. In other cases, for example when the memory has a NOR architecture, single defective word-line could be mapped out.

On Chip Self Calibration For Detection Time

The word-line leakage detection time depends on the parasitic capacitance, which can have large variations depending on architecture, voltage bias topology, and the number of planes. It is, consequently, preferable to have a method to calibrate the discharge time with a known leakage current. An on-chip self calibration algorithm is described in this section. A convenient way of accomplishing this, without needing to add extra elements, is to utilize a known current in the regulator to calibrate the detection time.

Figure 16:
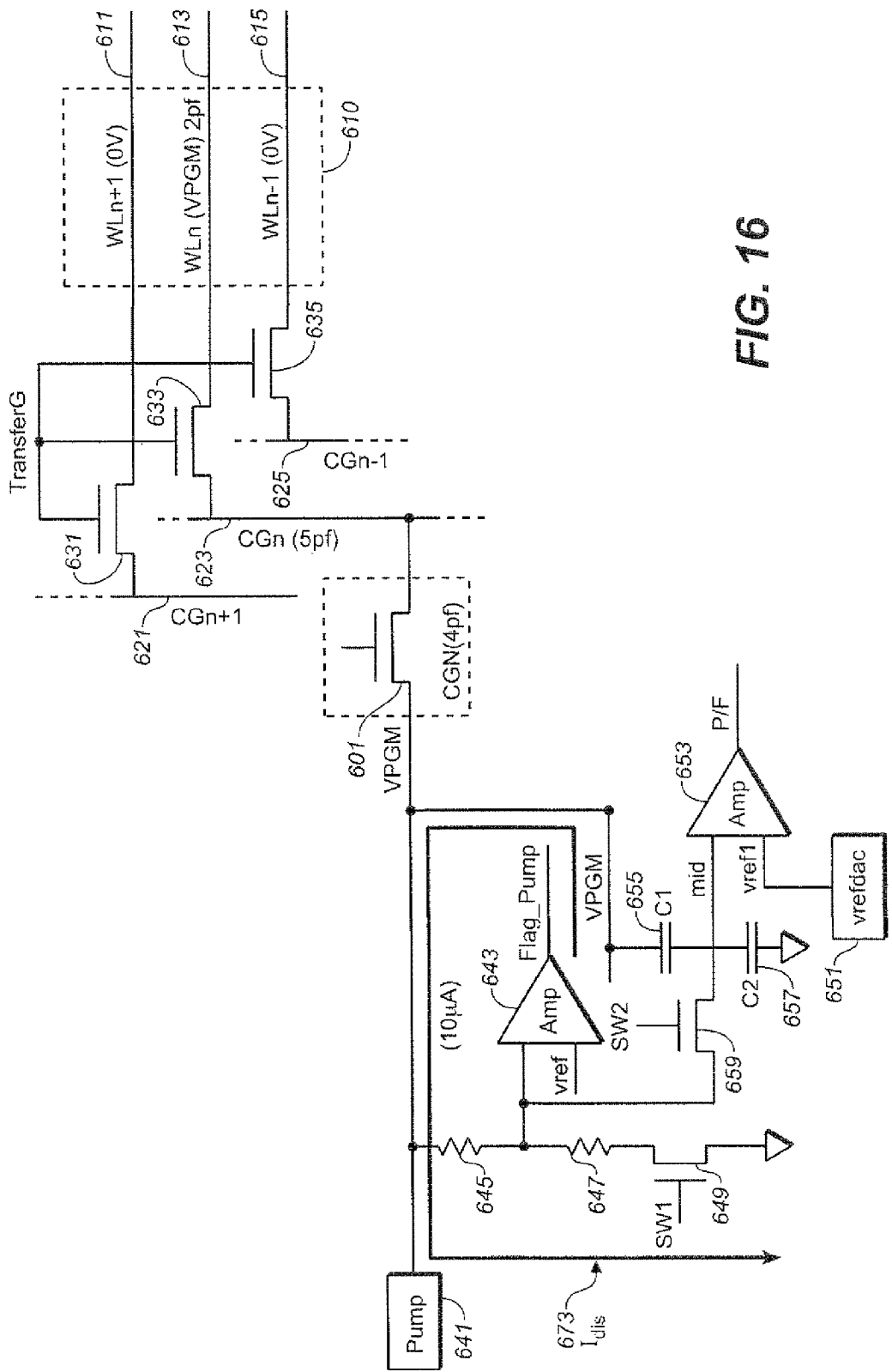
FIG. 16 shows the current path in a calibration process for the word-line leakage process.
Figure 17:
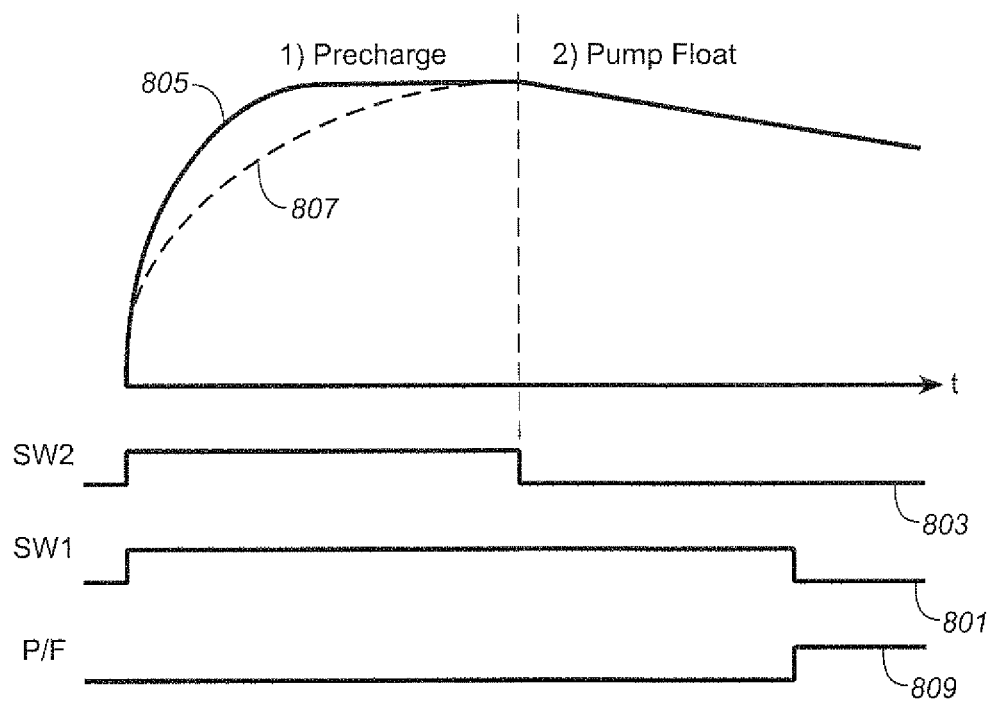
FIG. 17 illustrates the phases of the calibration operation.

FIG. 16 shows the same elements as in FIG. 14, but as shown in FIG. 16, the resistor voltage divider is used to discharge the high voltage during the calibration process, as shown by the current path Idis 673. These elements are again preferably implemented as peripheral circuitry on the memory chip and the path tested in the calibration process should match the path actually used for detection of leakage. During on-chip self calibration, a good block should be used to determine the characteristics of a block without any word-line leakage. The good block may be determined by its program characteristics or from other some other good block check. For example, data corresponding to the highest state can be programmed and read back to see if it is correct. When the calibration is done on a fresh die, wordline leakage will often not have begun to manifest itself and the location of a good block is generally easy. The calibration is similar with the real leakage test and can be performed in 3 stages, as shown in FIG. 17.

A first phase precharges the word-lines of the test block to the targeted voltage level pattern by turning on the high voltage pump, the CGN voltage selection circuits and the row decoder for selected block. The high voltage is regulated by the resistor voltage divider and the comparator to enable pump clock. In this step, SW1 and SW2 are both on, as shown respectively at 801 and 803. The word-lines charge up as shown at 805 and 807, respectively corresponding to 705 and 707 of FIG. 15.

The discharge phase will be different from the normal word-line leakage test illustrated in FIG. 15, During the discharge phase, the resistor voltage divider will be kept on with SW1=Vdd. But the pump is disabled and left floating and SW2=0 to isolate the mid node from the resistor divider. The high voltage VPGM will be discharged through the resistor chain with a fixed leakage current along the path 673 of a discharge current of $I_{dis}$ on the order of 10 µA.

When the output P/F 809 of Diff Amp 653 flips after comparing with a selected vref1 value, the amp output Pass/Fail will feed back to turn off SW1. A timer can start counting the time from the start of the discharge phase till the comparator flipping of P/F from pass to fail.

Based on detecting leakage-detection criteria and the ratio of this to the resistor leakage, the timer can be multiplied by a factor of 2 (such as 128) to set the timer counter for detecting targeted leakage current. For example, if the resistor leak 10 µA, the timer multiplying 128 will give the detecting current of 78 nA. (Other factors could also be used, but factors of two are readily implemented, as an easy way to multiply by 2 is to perform a shift of binary digits to the higher bits.)

The calibration only needs to be done once for a given voltage topology during die sort test. The timer digits can then be fixed and stored, for example, in a ROM fuse block. During power on read, the timer digits will be read out to registers and controls the word-line leakage test. For a different stress topology, a new calibration is needed, since the parasitic capacitance is changed. After each calibration, a corresponding timer parameter can be acquired and saved in the ROM flash memory.

The word-line leakage can be used during manufacture test, or for in-field tests once the device is out of factory. The micro-controller would issue the command to do the word-line leakage test in the user application. A convenient time to do the leakage test is before the erase operation, since the program disturb incurred during the leakage test can be eliminated by the subsequent erase operation.

Detection of Broken Word-Lines

This section looks at the detection of broken word-lines. As device size decreases, in addition to the likely increase in leaky word-lines, the occurrence of broken word-lines is also likely to become more common. A broken word-line will have a high resistive connection across the break, because of which the cells on far end of the word-line (on the other side of the break from the word-line driver) will see a voltage drop during both program and verify operations. This will lead to programming pulses having a lower amplitude, so that cells will be programmed less; but as the verify level is also lowered, these under-programmed cells may still verify. As a result, the threshold voltage distribution for the broken word line will show two humps, one corresponding to cells one side of the break and the other corresponding to cells on the other side of the break. The method described in this section can be used to identify the broken word-line failure and recover the data of the broken word-line.

There are various ways by which the broken word-line failure could be detected. One approach is to use a smart verify scheme, such as is described in US patent publications numbers US-2010-0091573-A1 and US-2010-0091568-A1. In this arrangement, the program voltage level is recorded when a certain number of bits pass the lower page program operation on each word-line. This recorded program voltage level is then used as a starting program voltage for the upper page of the same word-line. With this scheme, the number of program loops for each word-line is largely uniform, hence any variation in the total program loop number may be used as an indication of a broken word-line. However, as the program loop number in a broken word-line may not be significantly higher than typical, using the total program loop count to judge this failure could result in false alarms.

Another approach to detect this sort of failure is the "forbidden zone" read, where a read is performed to determine whether any cells have a threshold voltages in the region between the ranges allotted to data states. (See, for example U.S. Pat. Nos. 7,012,835; 7,616,484; or 7,716,538.) In this kind of scheme, after the program operation completes, a particular state can be sensed at two different levels and the results of the two sensing operations can be compared with each other. A scan operation can then be done to check then number of bits between the gaps of two reads which were sensed as non-conducting in one sensing operation, but conducting in the other sensing operation. This solution comes with performance penalty as every single program operation would be followed by two read operations and a scan operation.

Yet another method of identifying broken word-lines is to screen out the failure during die-sort. In this method, a whole block is programmed and then read back. (For example, when data is stored in a multi-page format, the lower page of each word-line can be programmed and read twice.) One read is done with a normal read point and another with a raised read point, similar to a forbidden zone read described in the last paragraph. The results of the two sensing operations are then compared using a test-mode command sequence. However, this will only pick up the word-line breakage that manifests itself at test time, when the symptoms often do not show up until the device has operated over some time. Also, when the word-line already exhibits breakage, it may not demonstrate this on every program cycle and, consequently, may be missed in a single test operation.

Figure 18:
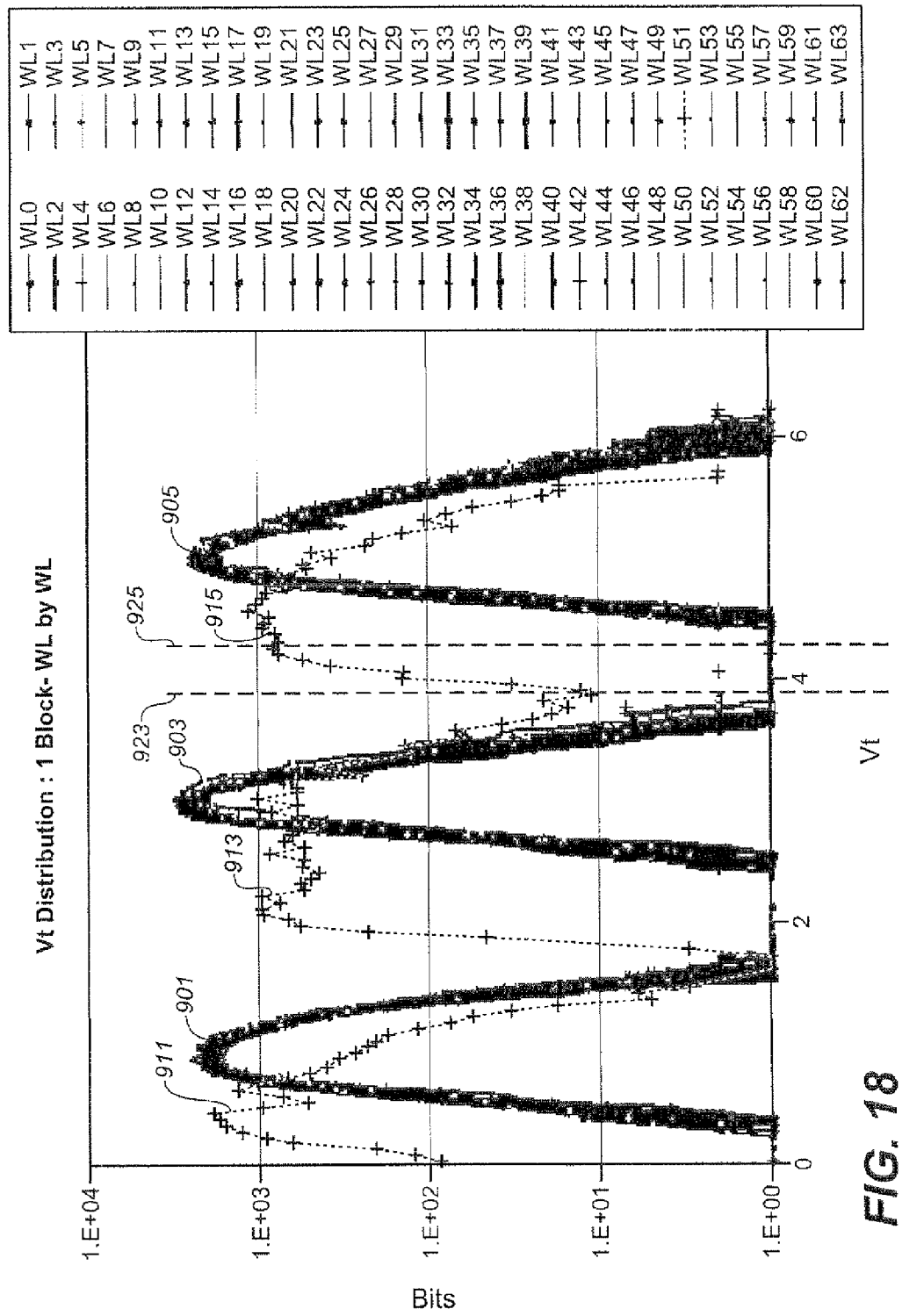
FIG. 18 shows the distribution of memory cell threshold voltage values to illustrate symptoms of a broken word-line.

Considering the problem further, the symptom of broken word-line failure is a distribution with two humps. FIG. 18 shows the threshold distribution of a block of a memory word-line by word-line, for the a 64 word-line example. The distributions for three states are shown at 901, 903, and 905. As shown, these form three well defined and separated humps, where the highest two states, for example, are separated by the region between 923 and 925. For a broken word-line, however, those cells on the far side of the break from the word-line driver will be shifter to lower threshold values, as shown at 911, 913, and 915.

Figure 19:
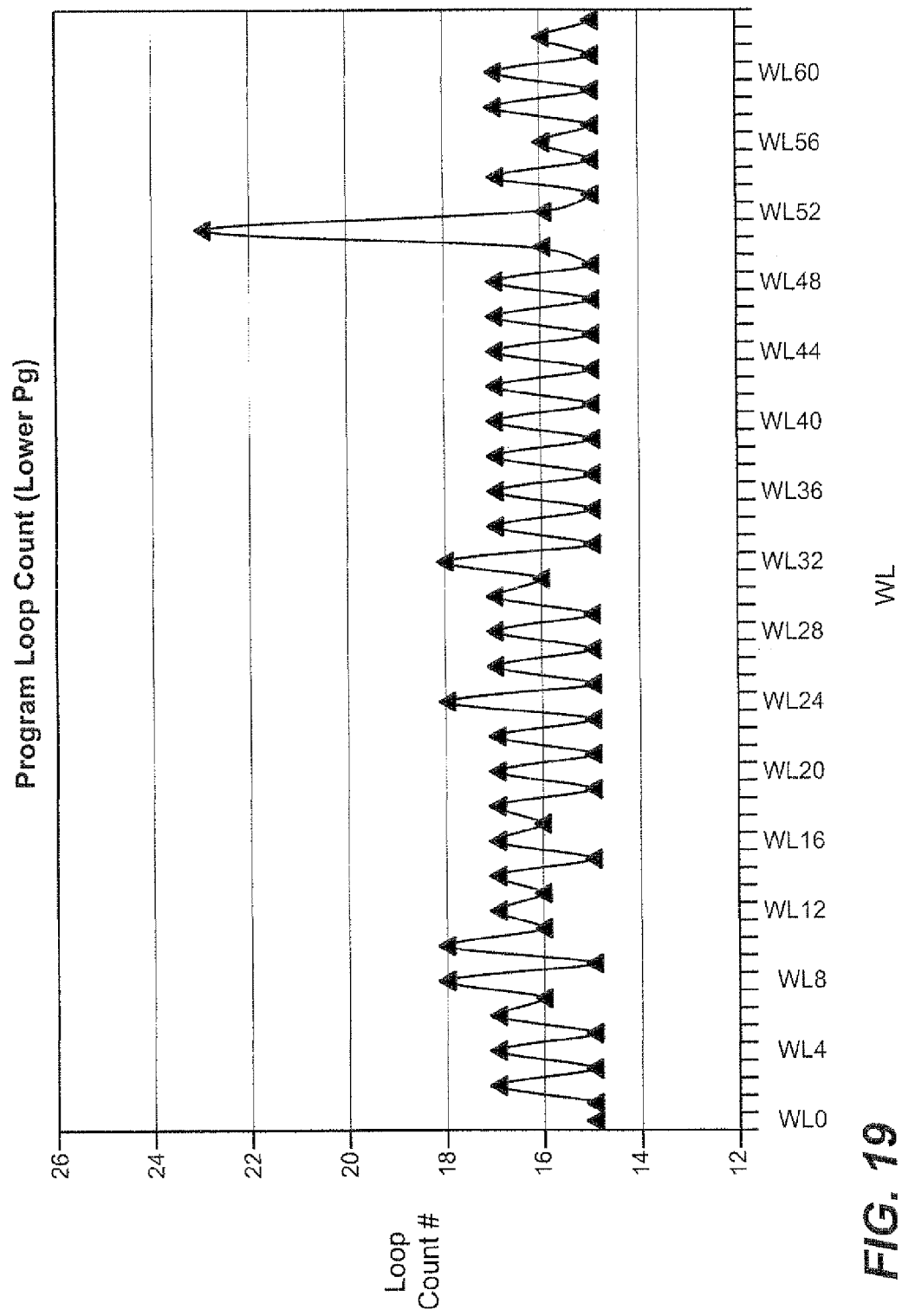
FIG. 19 illustrates the variation in the number of programming pulse-verify iterations over different word-lines.

The reason behind a double hump distribution is that the part of word-line at far end of the word-line driver will show voltage drop. As a result, the cells that are located at the far end of the word-line will program slower and pass verify at a lower voltage. Since the failure will not cause a program status failure, it may not be detectable for a typical program failure mechanism. Programming a broken word-line will show some program loop variation, but word-line-word-line and block-block variation make it difficult to judge the failure based on the program loop count, as can be illustrated with respect to FIG. 19. FIG. 19 shows the number of pulse-verify, iterations, or loop count, for each word-line to program, in this example, lower page into a 64 word-line block. As shown there, the loop count fluctuates over the different word-lines by several counts. These variations can reflect fluctuations due to the design particulars, such as whether it is an edge wordline or a central wordline, or how many erase-program cycle the wordline has experienced, as well as process variations. In the case of WL50, the loop count is noticeable higher than the other fluctuations, indicating what may likely be a broken wordline, although further tests would be used to confirm whether it is actually broken or this is just a false alarm.

The techniques presented here make it possible to detect broken word-line failure by comparing the program loop count for the cells located on two different sides of the fault. The cells along word-line are programmed and it determined how it takes the cells of different groups or subsets of these cells to verify as programmed to target state, such as writing all the cells to have a programmed lower page. A group with cells on the far side of a break from the word-line driver will take longer to program than a group that has all of its cells between the driven and the break. As memory cells are typically programmed using an alternating pulse-verify algorithm, this can be done by keep track of the number of pulses, or loop count, needed by the different groups or just the difference in the number required. The programming can be done for all of the cells along word-line or some portion of them, such as for system that program the odd bit lines and even bit lines separately. In the exemplary embodiments, the subsets of cells that have their loop counts compared are the contiguous subset of cells of the segment of one end of the word-line and the segment at the other end of the word-line. More generally other subsets of the cells could be used, but by looking at segments from the two ends of the word-line any break should be caught without having to do multiple comparisons of groups' loop counts; and looking at segments of the word-line is generally more readily implementable in the exemplary architecture than if the groups are formed from non-contiguous subsets of the cells, overlapping subsets, or some combination of these. To be able to compare the loop counts meaningfully for the different segments, their cell should be programmed with the random data, for example, in a multi-page format. The loop count comparison between two end of the wordline will eliminate the wordline to wordline or block to block variations. The cells on the same word line will follow similar programming characteristics.

Memory devices often already include a scan to check for failed memory bits when programming. The exemplary embodiment incorporates the broken word-line detection into such a routine, which can have several advantages. One is that such scans may already keep track of the loop count for the memory cells or segments as part of their algorithms. Also, as allows the broken word-line check to be performed many times after the device has been in operation, it can pick up breakages that only manifest themselves after device test or that are not detectable at every test.

In an exemplary algorithm, the broken word-line detection is incorporated into a failed bit detection that is done during the last few program loops and which counts the failed bits segment by segment, the word-lines being subdivided into multiple segments. In the exemplary memory embodiment presented above, each the segments can be taken to correspond to one or several adjacent ones of the read/write stacks as shown in FIG. 7. While this scan is ongoing, the scan result of first physical segment and last physical segment on the ends of the world-line can be monitored. When the failed bit count for either one of these two segments end goes below a fixed (in this example) criterion, a signal is latched high to mark the passing of the one segment.

An up-counter can then be triggered when the first of these segments passes the scan. The counter is then stopped when the slower of the two segments passes scan operation. At the end of program routine, the output of the up-counter is compared to the fixed criterion. If the count is higher than the criterion, a signal can be latched high to indicate that a broken word-line has been detected. The up-counter can be implemented on the state machine (112 FIG. 8). As the up-counter can simply count the program look stating when the one segment passes the its write criteria, the on-chip state machine will typically be able to keep count of the program loops, so this adds an additional count for it to maintain.

If a broken word-line is detected, its program status should be set to fail and the corresponding cached data should be terminated. The controller can then toggle out the next page of data that if it has been already loaded in the data latches. The next page data can also be programmed to a different location instead of toggling the data out to controller. The data of the failed data page and any corresponding lower pages can then be recovered by issuing a command sequence that will trigger read operation with shifted read voltage levels. (Aspects of data recovery and corresponding latch structures are described in U.S. Pat. No. 7,345,928.)

Figure 20:
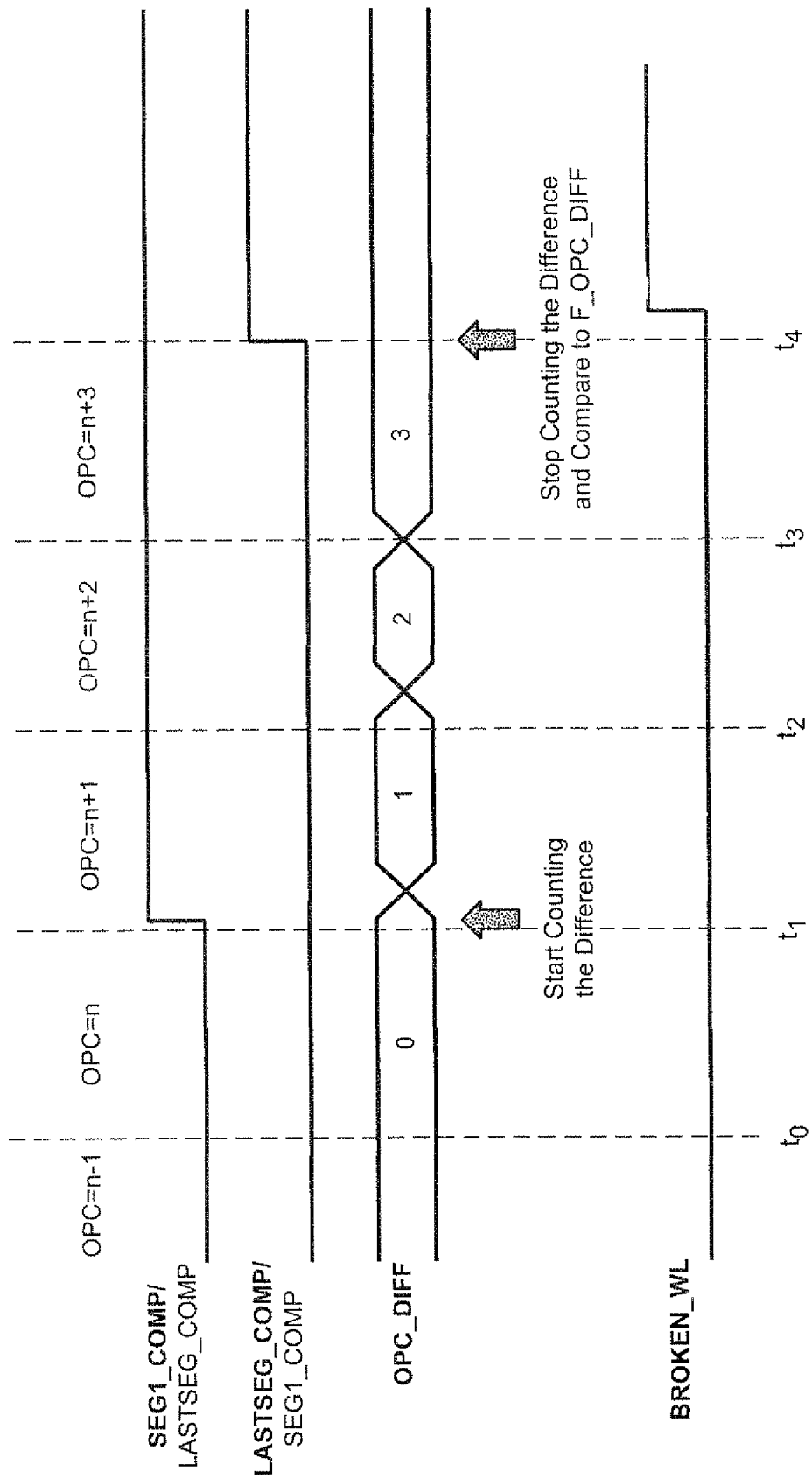
FIG. 20 is a timing diagram for a broken word-line detection routine.

The process can be illustrated by the diagram of FIG. 20 that shows the waveforms for some of the signals involved in this scheme. In this diagram, OPC is the program loop count, corresponding the iteration in the pulse-verify sequence. OPC_DIFF is the up-counter for counting the program loop difference. SEG1_COMP is the latched signal to indicate the passing point of first of segments. LASTSEG_COM is the latched signal to indicate the passing point of the last segment. FIG. 20 picks up the program process after n−1 loops have been completed at time $t_0$.

Initially, SEG1_COMP, LASTSEG_COM, and the BROKEN_WL signals are all low and the up-counter is initialized to 0. At $t_1$, corresponding loop count n, a first one of the end segments (here taken as the first segment) reaches its passing point and SEG1_COMP goes high and the up-counter starts, as shown as OPC_DIFF. OPC_DIFF continues to increment up with the loop count until the other of the end segments (here the last segment) passes at $t_4$, corresponding to loop count n+3. The signal BROKEN_WL then goes high when OPC_DIFF>F_OPC_DIFF.

Figure 21A:
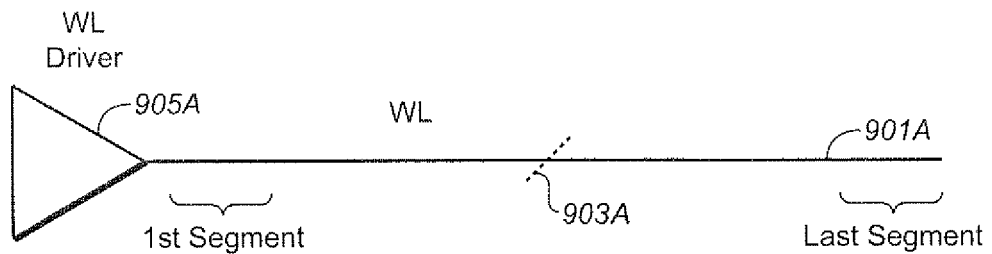
FIGS. 21A and 21B illustrate differing placements of word-line drivers.
Figure 21B:
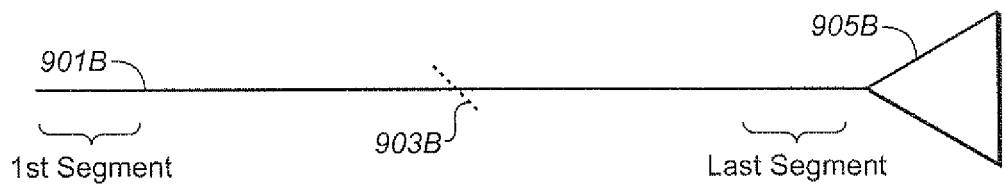

One complexity that can involved in implementing the above described scheme is the case when the architecture use two sided word-line drivers, placing drivers on both sides of the array (such as would be in the row decoders 230A and 230B of FIG. 1). This can be illustrated by FIGS. 21A and 21B. In FIG. 21A the word-line WL 901A has the driver 905A to the left, closest to the driver. The last segment along the word-line 901A is on the other side of the break 903A from the driver 905A and will consequently see lowered voltage levels and be slower than the first segment. In FIG. 21B the word-line driver 905B is to the right and closest to the last segment close to the last segment along word-line 901B. In this case, the first segment will be on the far side of the break 903B, receive lowered voltages and the first segment will be slower than the last segment. Under such an arrangement, it cannot be assumed that the last segment will pass last, since it may be closest to the driver.

Figure 22:
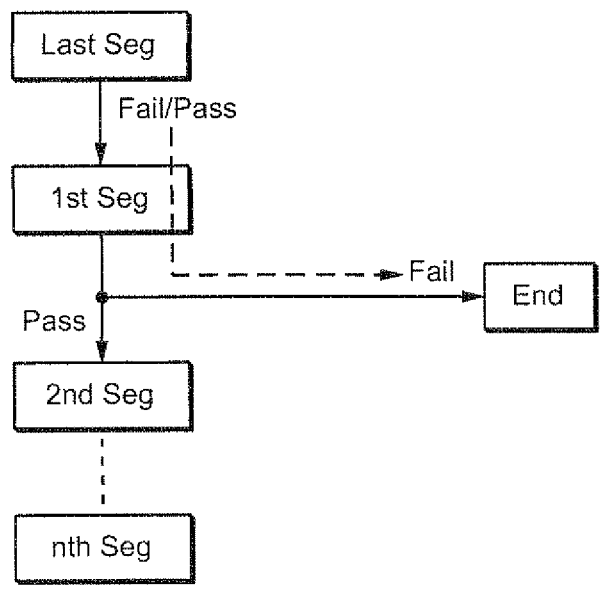
FIGS. 22 and 23A are flows for a scan of failed bits in a program operation.

The incorporation of broken word-line detection into a failed bit scan routine is considered further for the case where the memory array includes a number of redundant columns (for use replacement of defective columns), which are placed to the left side of the array so that they all are found in the last segment. (Such an arrangement is described in more detail U.S. Pat. No. 7,170,802, for example.) One way of implementing a failed bit scan for such a circuit is to scan the segments in the following order: Nth segment (last segment)-$1^{st}$ segment-2nd segment . . . (N−1)st segment. The Nth segment is checked first since this will give an indication of the number of available spare columns to which data from defective columns in other segments can be remapped. In a normal segmented bitscan, such as that described in U.S. Pat. No. 7,440,319 and which can serve as a basic embodiment upon which this discussion can build, if one segment failed the criteria, the rest of the segment will not be scanned to save time. If segment N fails, the circuit does not proceed to scan the first segment. The process then moves through the other segments, where the criteria for these other segments will preferable consider not only the number of failed bits in this segment but also the number of failed bits in the last segment counting the failures of the replacement columns. In an exemplary embodiment, in case of two sided word-line drivers, the scan circuit should be modified such that it continues to scan the first segment even if the last segment fails. This is shown in FIG. 22. Under this exemplary embodiment, the segmented bitscan is include as part of a normal program algorithm. The broken wordline detection scheme can be integrated into a similar state machine to that for segmented bitscan without the detection. In this arrangement, when the last segment fails, the segmented bitscan is not terminated because the first segment should also be checked to see at which program loop it passed the program. Under the arrangement of U.S. Pat. No. 7,440,319, if any segment does not finish programming, it is counted as the whole page of data not being finished, and terminates as soon as one segment fails. Similarly, when the broken word line detection is incorporated, the exemplary embodiment will go through the last segment and continue to the first segment regardless of whether the last segment fails or passes.

Figure 23A:
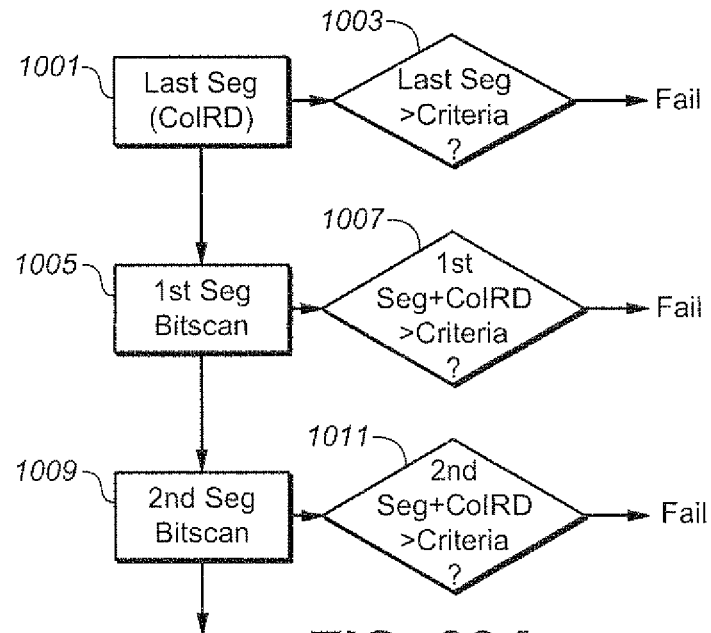
Figure 23B:
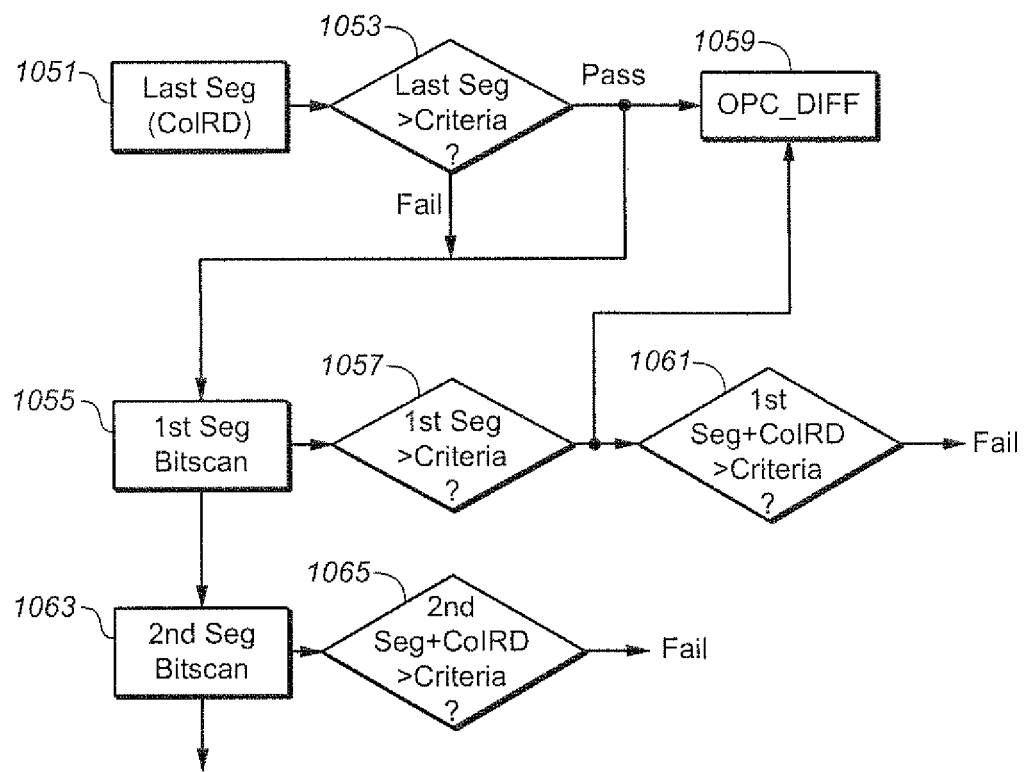
FIG. 23B is a flow for a scan of failed bits in a program operation that also includes broken word-line detection.

In addition to the changes just described with respect to FIG. 22, the failed bit scan routine is also modified to include the broken word-line detection process. As noted above, the exemplary embodiment includes redundant columns, so the number of failed bits allowable in the other sections depends not just on the number of failures there, but also on the number of redundant bits available in the last segment that could be substituted in for failed bits in the first segment. For example, the failed hit count of last segment and first segment are added together and then compared to the criterion in order to determine pass/fail status for first segment. In the exemplary embodiment that incorporates broken word-line detection, the flow will be modified such that the failed bit count for failed segment can be compared to the failed bit criterion in order to determine pass/fail for first segment. FIGS. 23A and 23B show the comparison between a counting scheme that includes neither broken word-line detection nor the process of FIG. 22 (FIG. 23A) and the exemplary embodiment that includes both (FIG. 23B).

The first of these is schematically illustrated in FIG. 23A, which starts at 1001 with a scan of the last segment, including the redundant columns (ColRD), which is then compared against its criteria at 1003 to determine if the last segment has failed. In this embodiment, the process continues (pass or fail) on to the first segment scan at 1005. The criteria used at 1007 for the first segment is compared not just to the scan result for the first segment itself, but also takes into account the number of redundant columns (ColRD) available. If the 1st segment test at 1007 is passed, the flow similarly continues on to the second segment at 1009 and 1011, and so on through the other segments.

In order for the scheme to work correctly in case of two sided word-line drivers, the scan circuit will need to be modified such that it continues to scan the first segment even if the last segment fails. The diagram of FIG. 23B shows a scan algorithm to account for this and that includes the broken word-line check. As before, the scan of the last segment 1051 is compared against the corresponding criteria at 1053. In this embodiment, the process will again continue on the scan of the first segment, 1055, regardless of whether or not the last segments passes or fails, going from 1053 to 1055 if 1053 fails. If 1053 passes, the flow will now go to 1059 as well as 1055. It should be noted that a broken wordline does not necessarily fail to program When the segment is far from the wordline driver, it will be slower to program, by not necessarily impossible. Hence, it may eventually pass, but it is needed to determine the programming speed at both ends of the wordline, which may differ significantly, in order confirm that a wordline is actually broken.

When the last segment passes, it will trigger the OPC_DIFF block, as will the first segment from 1057, with the first of these to pass starting the counting and the last to pass stopping it in order to count the difference. At 1057 it is judged whether the first segment itself, without the inclusion of redundant columns, passes or fails. As noted, the determination of wordline breakage at 1059 will be based difference from the first segment (alone, without redundant column considerations) and last segment loop counts. 1061 is the bitscan for program status as before, where columns of the first segment may have defective columns replaced by redundant columns (from the last segment). Because of this, both 1057 and 1061 are included in the flow. The process then continues on to the second segment at 1063, 1065 and other segments as before.

By introducing this scheme, the number of defective devices due to broken word-line failures can be reduced without performance penalty. Further, as this is included as part of the programming routine, it is able to pick up breaks that only manifest themselves after a device is shipped. This allows it to be a more efficient and accurate method of broken word-line detection compared to the other methods due to the fact that it is in-field detection. It can reduce the program loop count variation due to word-line-word-line, block-block and chip-chip variations with no performance penalty and avoids time-consuming die-sort screens.

Determination of Word-Line Leakage by Current Comparison

This section returns to the consideration of word-line leakage and considers some additional techniques for its detection. As before, the techniques can be used to detect word-line leakage to the substrate or to neighboring word-lines. The techniques discussed in the following can be particularly useful for distinguishing the presence of leakage current against the background noise current of a device. Even when no word-lines are selected, there will be some junction leakage current on the path by which the word-lines receive their voltage as it is delivered to through junctions connected to supply the control gate voltages. For example, referring back to FIG. 12, even when the word-line select gates 631, 633, 635 are turned off, there will be some leakage. This background leakage noise will vary with process and temperature variations, and can range over a rather large difference of magnitude. To remove this background current noise, the techniques of this section compare the current drawn by a plane of the memory when no word-lines are selected to the current drawn when a set of word-line are selected. This can be done by using two different planes or by the same plane, where one of the values (such as the reference value with no word-lines selected) is measured and recorded and then compared to the other value. As to when the testing process is performed and the patterns of word-lines selected for leakage testing, these can be the same as discussed above with the other embodiments on detection of word-lines leakage.

Figure 24:
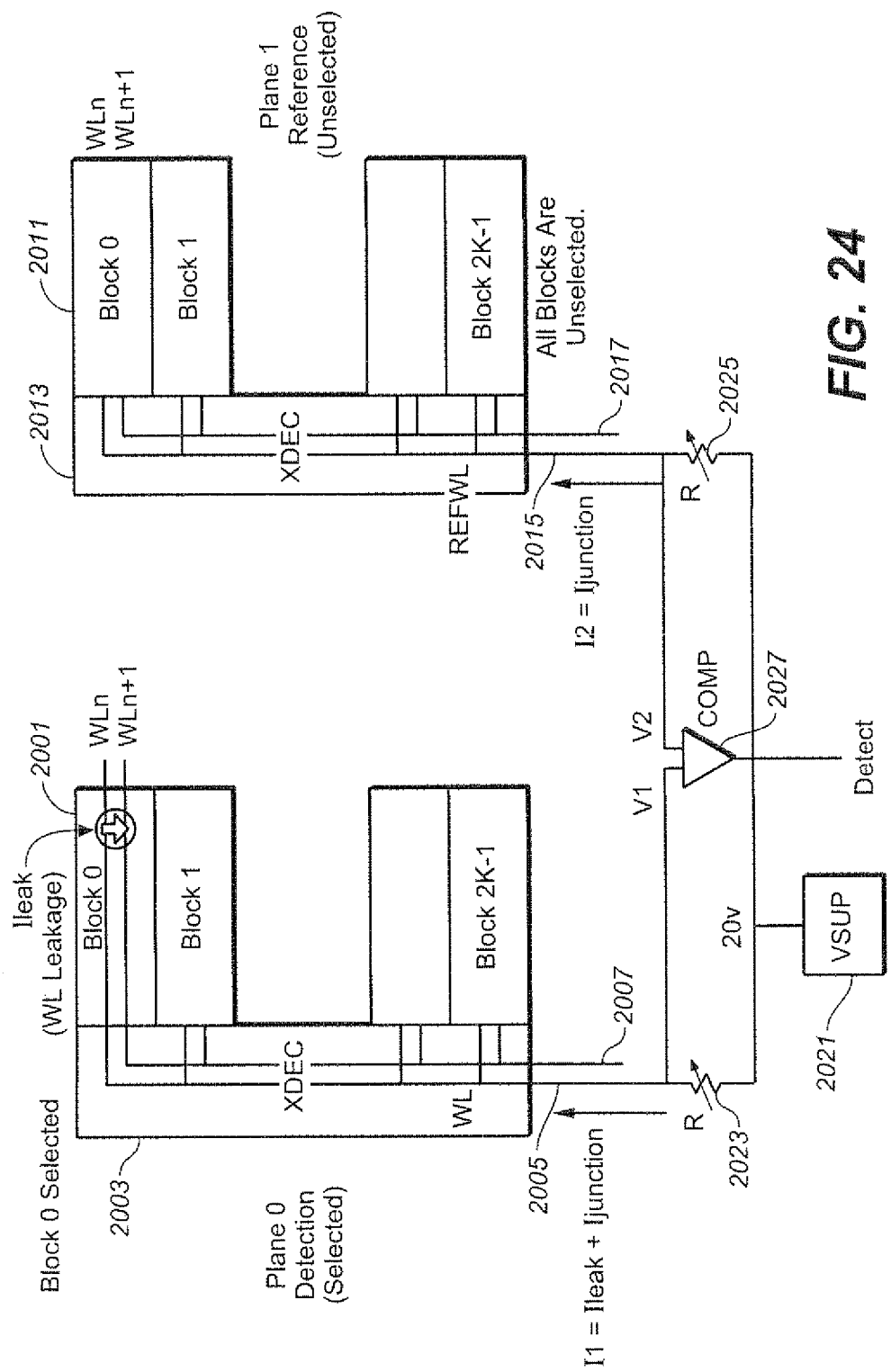
FIG. 24 illustrates a current based comparison for leakage determination where two different arrays are used, one unselected and for reference use and one with an erase block selected for testing.

The concept can be illustrated with respect to FIG. 24 for the case where two different arrays are used, one unselected and one with an erase block selected for testing, and the two currents are generated at the same time and compared directly. A voltage level, in this example 20V, is generated in a supply VSUP 2021 and supplied through respective resistances R 2023, 2025 to the word-line decoding circuitry of a pair of planes (semi-autonomous memory arrays) Plane 0 2001 and Plane 1 2011, each taken to be of the same design of 2K erase blocks and having respective word-line decoding circuitry, including the word-line selection switches, XDEC of 2003 and 2013. In Plane 0 2001, Block 0 is selected for leakage testing. To do this, the selection circuitry applies a voltage pattern to Block 0's word-lines; for example, a stripe pattern could be applied with the high voltage from line 2005 on ever other word-line and the non-selected word-lines left to float or taken to ground by line 2007. This will detect leakage between the word-lines and also between the (high) word-lines and the substrate. The word-lines in the unselected blocks of Plane 0 2001, and all of the blocks in Plane 1 2003, are then left to float with their word-line select switches turned off. Even though Plane 1 2011 is non-selected, all of the same voltages are supplied along lines 2015 and 2017 to Plane 1's XDEC circuit 2013.

Even though no word-lines are selected in Plane 1 2011, it will drawn a certain amount of current ($I_1 = I_{junction}$) due to junction leakage that will serve as a reference value. Plane 0 2001 will drawn both junction leakage current and any word-line current $I_{leak}$. By looking at the voltage difference between node $N_0$ and node $N_1$, the current leakage can be isolated. If the voltage difference, $\Delta V = (V_1 - V_2) = I_1 R - I_2 R = I_{leak} R$, as compared in COMP 2027 exceeds a threshold, the Detect signal is asserted to indicate that the selected Block 0 has leaky word-lines. In response, the bad block can be mapped out or other corrective actions taken.

Consequently, by using a reference plane and current sensing, the word-line leakage can be detected. Any background noise (junction leakage) will be cancelled through the comparison, since both sides see the same amount of junction area. There is then no reference noise due to differential sensing. Also, the sensing speed is improved since it uses current sensing; and, much as described further for the embodiment presented below, additional reference current can be injected in reference path for margin test.

The arrangement of FIG. 24 requires a device with at least two planes. To be accurate, it also needs that the planes are well-matched: that the reference and selected planes and word-lines have good matching in loading; that the background junction leakage average of the 2K blocks should be at the mean of the distribution; the leakage current on the selected and reference word-lines should match; that the actual leakage criteria is measurable over the difference background leakage; and that the device and resistors are well matched. Also, as the current being drawn through the resistance 2023 is increase by higher $I_{leak}$ values, this can effect the value of R and result in the $I_{junction}$ component not accurately cancelling between the planes (although this effect can be reduced by use of current mirrors, much as described below). The next embodiment overcomes or reduces these various complications.

More specifically, in one preferred embodiment word-line to word-line and word-line to substrate leakage can be detected in-field by determination of a reference level, with all word-lines and blocks de-selected, and then applying a stress mode level done on the same plane by applying voltage levels in a stripe mode on a selected set of word-lines, typically taken to be from a single erase block. To facilitate the accuracy of this process, the exemplary embodiment uses a current mirror scheme.

To give an idea of the current levels involved, calculations for a typical device (based on electronic design rules) give values for maximum junction current at high temperatures to be on the order of several micro-amps and at low temperatures to be on the order of a few tens of nano-amps. Thus, the level of background noise from the junction leakage can vary widely depending on conditions. The amount current that a leaky word-line, whether the leakage is to another word-line or to the substrate, be on the order of a hundred nano-amps to tens of micro-amps. As these numbers illustrate, the relative amount of noise (junction leakage) can be high when compared to the signal (word-line leakage), and both values can vary significantly depending of operating conditions. Consequently, to be able detect word-line leakage, it is useful to have a common-mode current to speed up the detection time, particularly in case junction leakage is low.

In the exemplary embodiment, each plane independently uses a current mirror and current sensing to determine the word-line leakage current. To determine leakage, current is sensed two times (a reference current value and word-line leakage current) and the values are stored digitally and then compared at the end of operation. This arrangement helps to reduce the error terms from current minor, leakage, and op-amp mismatch. The basic operation can illustrated with respect to FIG. 25.

The current being drawn by the array, where for determining the reference value or for the leakage test, is mirrored and flow down the left side through the transistor 2105. The level MON is at a high voltage and FLG, on the other side of the inverter 2101 is low. The gate of the transistor is controller by the 8-bit (in this example) DAC counter 2107 which starts from the high value (FF in hex) and decrements downward. (Alternately, it could start at the low end and increase, but starting high can have benefits in terms of settling times.) The count continues until the level at MON is pulled above a trip point of FLG, at which point the counter value is stored into the latch Register 2103. After doing this once to determine the reference values, the selected testing pattern is then applied and the process repeated, after which the results are compared to determine if the leakage for the selected set of word-lines exceeds the allowed amount. (Alternately, the reference level determination could be second.) If multiple blocks, or differing applied voltage patterns (e.g., switching which word-lines are high and which are low) are to checked in the same set of test, the reference level need only be done once and used for the various comparisons.

Figure 25:
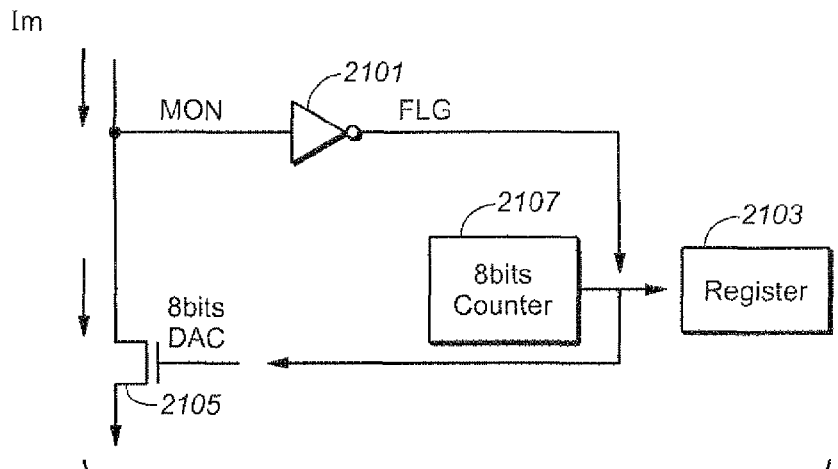
FIG. 25 illustrates the basic operation of exemplary circuitry for determining a leakage current level.
Figure 26:
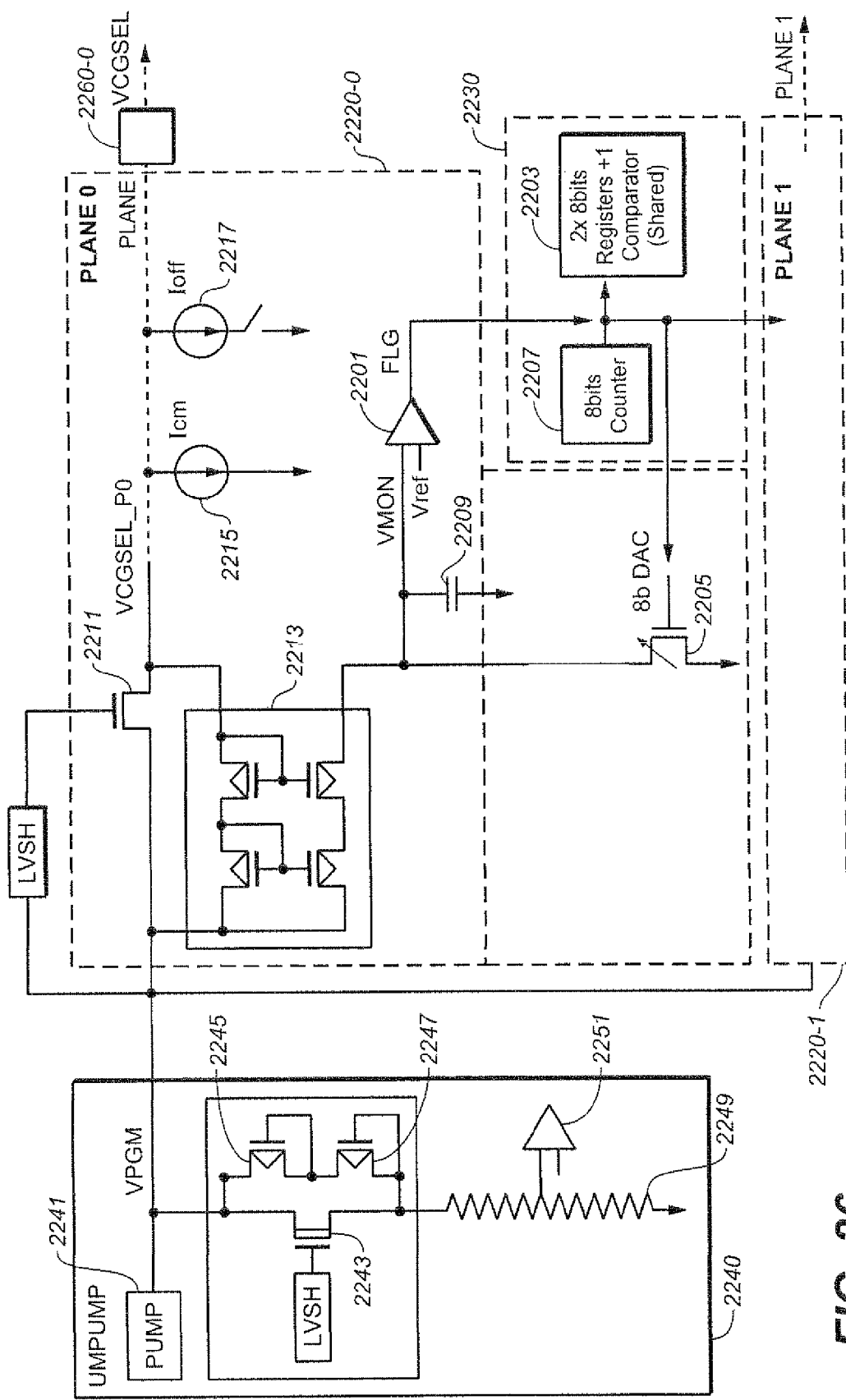
FIG. 26 shows the elements from FIG. 25 along with some to the other elements used in the exemplary embodiment for the leakage determination circuitry.

FIG. 26 shows the elements from FIG. 25 along with some to the other elements used in the exemplary embodiment for the leakage determination circuitry. Theses elements are connected between the charge pump circuitry 2240, which supplies the high voltages used to apply the test voltages, and the decoder circuitry of the memory plane or planes, which applies the voltage to a selected set of word-lines. In the exemplary embodiment, this circuitry is split into a part that is specific to each plane and, for multi-plane devices, a portion that is shared between multiple planes. The example uses a 2-plane device.

The charge pump system UMPUMP 2240 includes the pump 2241 itself that supplies the high voltage used for testing (here a programming voltage VPGM) and also the resistance 2249 and the comparator 2251 used to set and regulate the value of VPGM. The transistors in between will be discussed below. The voltage is then supplied to the leakage determination circuitry 2220 and 2230.

The portion specific to plane 0 is 2220-0 and the portion specific to plane 1 is 2220-1, with the shared portion as 2230. The portion 2220 transfers the voltage form the charge pump system UMPUMP 2240 to the decoding and word-line circuitry VCGSEL 2260-0, here shown only for plane 0. This is supplied as VCGSEL_P0 and the switch of high voltage transistor 2211 is used to by-pass the detection circuitry for normal operations by passing VPGM to the gate of 2211 by closing the circuit through LVSH. Similarly, during normal operations, the high level of LVSH is also applied to the gate of the high voltage switch of transistor 2243 and the pump system UMPUMP 2240 operates in its typical manner by-passing 2245 and 2247. During testing, both of 2211 and 2243 will be off.

During testing, to determine the amount of current being by the plane, the amount of current being drawn needs to be determined using the process described above with respect to FIG. 25. Rather than use the actual current, and thereby dilute but the measuring process, the current is mirrored by the current mirror 2213, here formed by two pairs of high voltage PMOSs. As some voltage is dropped across the path of the mirror 2213 between UMPUMP 2240 and VCGSEL 2260-0, the two high voltage PMOSs 2245 and 2247 are used to replicate threshold voltage drop across the mirror.

The mirrored current is then used to detect the leakage, whether the reference value or the actual leakage test value, as described with respect to FIG. 25. Transistor 2205, comparator 2201 (here just represented as an inverter), counter 2207 and register 2203 of FIG. 26 respectively correspond to the elements 2105, 2101, 2107 and 2103 of FIG. 25. The comparator 2201 is now also explicitly shown to have as input a reference voltage Vref that could be supplied by, for example, a bandgap circuit. The capacitor 2209 is also added to smooth out the VMON level. In this embodiment, the elements 2205, 2209, and 2201 are specific to block 2220 of each plane. The block 2230, including counter 2207 and the register/comparator 2203, is shared between block. The counter/comparator 2203 will have a register for each block (2 by 8-bits in this example) and one comparator that can be shared by both planes.

Block 2220 also includes Icm 2215 as a common mode current source to set a minimum current flow through the current mirror to meet settling/detection time. The offset detection current source Ioff 2217 is used during the leakage determination process (including determining the reference value) so that a good block is not detected as bad due to noise determination or detection of error. The offset detection current is used to set a threshold to mark bad block for this purpose.

Figure 27:
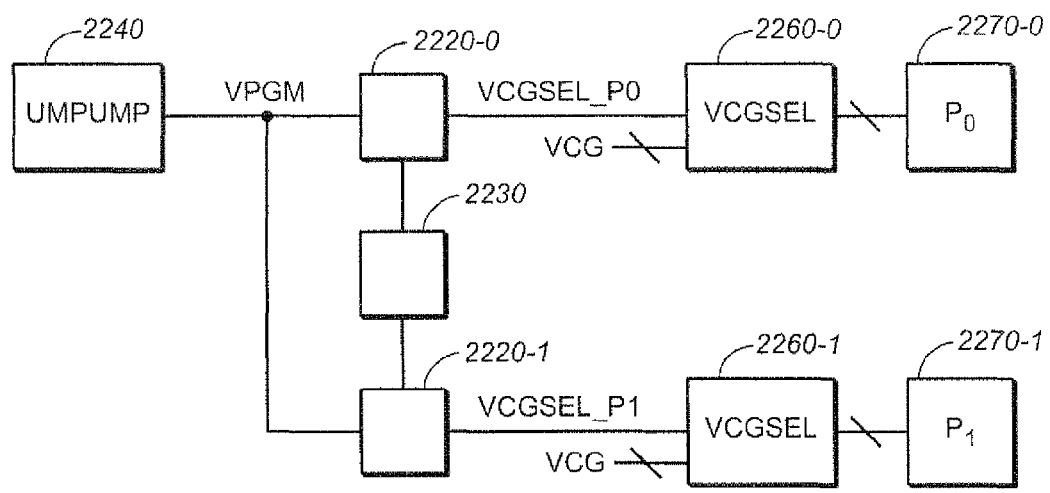
FIG. 27 is a block diagram to schematically illustrate the relationship of the elements of FIG. 26 to two planes.

FIG. 27 is a block diagram to schematically illustrate the relationship of the elements of FIG. 26 to the two planes. The planes P0 2270-0 and P1 2270-1 each have their respective word-line decoding circuitry VCGSEL 2260-0 and 2260-1 that includes the word-line select switches (631, 633, 635 of FIG. 12), as well as any other intervening selection circuitry. In addition to selectively applying VPGM to word-lines, this will apply any other appropriate word-line levels for the various memory operations, where these voltages are collectively indicated as Vcg. (The other peripheral circuitry of the memory circuit is again suppressed here to simply the discussion.) The blocks 2220-0, 2220-1, 2230, and the pump UMPUMP 240 are then as discussed with respect to FIG. 26. In normal programming operations, the blocks 2220-0, 2220-1 are basically by-passed and the same basic paths can be maintained, delivering VPGM as needed; during the word-line stress, however, the new features are then used.

Figure 28:
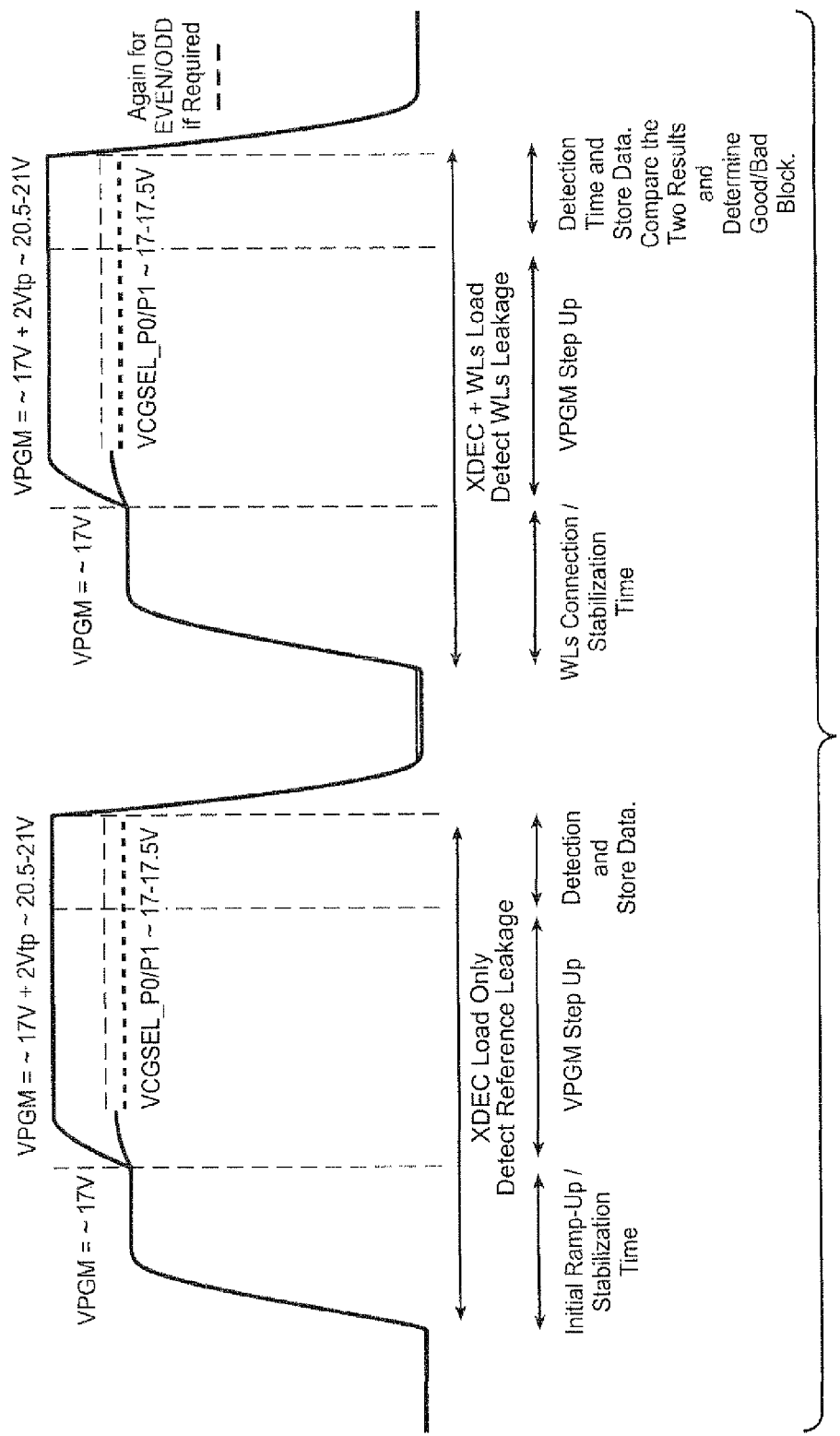
FIG. 28 is a timing diagram for one particular implementation of the leakage determination operation.

FIG. 28 is a timing diagram for one particular implementation. Here the reference value for the array, but the order could be switched. In this first sub-operation, only the load from the word-line decoding and selection circuitry (or XDEC) is driven to determine the reference leakage. First is an initial ramp-up and stabilization time, during which the current mirror circuits (2213, and 2245, 2247) are bypassed. Here the VPGM value is taken as to be around 17V and the duration of this phase could be something like 50 microseconds, to give them concrete values. Next, the level of VPGM is stepped up to compensate for the voltage drop across the current mirror by replicating the threshold voltages along the path. The LVSH switches are disabled on the current mirror circuits are enable. This takes VPGM to something like 17V+2 Vtp, where Vtp is the threshold voltage of the PMOS devices in the path, so that VPGM is ~20.5-21V. This leave VCGSEL, on the other side of the transistors, back at around the initial VPGM value of ~17-17.5V. Here, 200 µs are allotted for this sub-phase. After this follows the detection and store data sub-phase. The duration of this part is determined by the step time of the counter's (2207) time step. Once the reference value is set, then VPGM can be taken low and the leakage determination phase can begin.

To detect the word-line leakage, the load will now include a selected set of word line as well as the decoding circuitry. The first two sub-phases are largely the same, except of the change in load. The last sub-phase, of detection and latching the value is much the same, except that it will now also include the comparison of the two results and the determination of whether the selected set of word-lines, typically a block, contains any leakage. If any additional checks are to be done at this time, such as for instance switch the selected pattern between the even and odd word-lines of a block, they can be executed using the same reference value.

Figure 29:
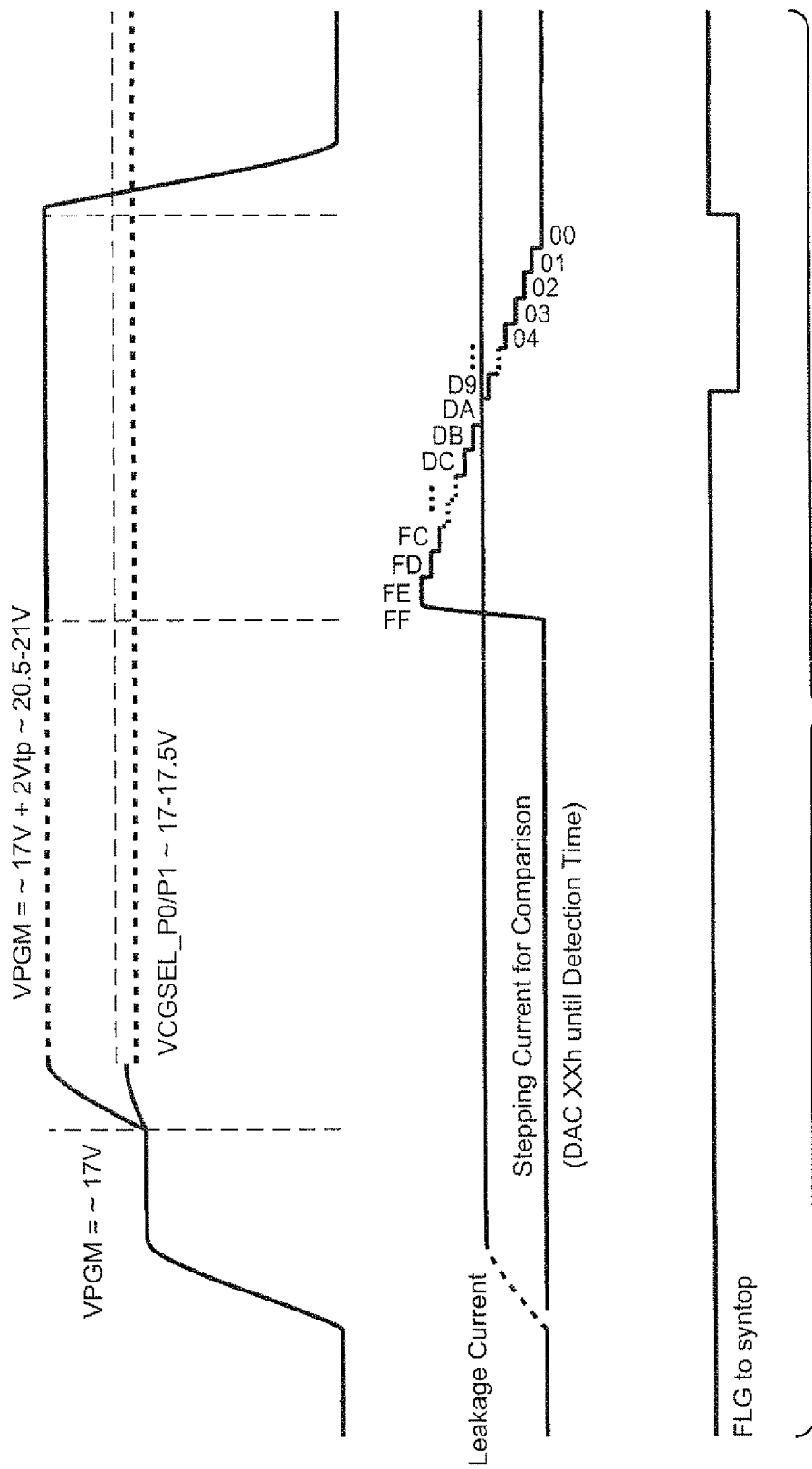
FIG. 29 adds leakage current determination elements to the part of the waveform of FIG. 28.

FIG. 29 repeats the waveform for one (it can be either one) of the phases of FIG. 28, but also shows the leakage current from the array superimposed with the stepping current as determined by the counter (2207, FIG. 26 or 2107, FIG. 25), and the FLU signal from the comparator 2201. Once VPGM is take high in the ramp-up and initialization phase, any leakage current begins to be drawn and the VPGM value is then stepped up. For the detection, the stepping current then begins counting. In the exemplary embodiment, the count will start high and then decrement as this will allow better VPGM settling time and better accuracy through the detection range. Once the stepping current falls below the leakage current, FLU goes low and the data value is latched in register. Once both the reference (REF) and leakage detection test (DET) values are latched, then can be compared. If DET>REF, the block (or other selected set) is marked as bad, and if DET<REF, the block is marked as good.

FIG. 29 illustrates the "normal" case, where the leakage is within the range of the stepping current. The logic also preferable handles the cases where the leakage exceeds the stepping current range and also when the level of leakage is very small. For the case when the reference leakage is high, the result is marked as good, while for leakage determination test, the block will be marked as bad. The case of the leakage current being less than stepping current for the REF value determination can be avoided as the common mode current, offset current, or both can adjusted to set the REF leakage to lie in the stepping range. For the DET value, if this is below the stepping range, the block (or other selected set of word-lines) is marked as good.

Conclusion

Although the various aspects of the present invention have been described with respect to certain embodiments, it is understood that the invention is entitled to protection within the full scope of the appended claims.

It is claimed:

1. In a memory circuit having memory cells of one or more arrays formed along word-lines, a method of determining whether one or more of the word-lines are defective, the method comprising:

applying a voltage to a first array while all of the word-line selection switches thereof are turned off;

establishing a first current level, where the first current level is the level of current drawn by the first array while all of the word-line selection switches thereof are turned off;

applying the voltage to a second array while the word-line selection switches of a selected set of the word-lines of the second array are turned on and all of the other word-line selection switches for the second array are turned off;

establishing a second current level, where the second current level is the level of current drawn by the second array while the word-line selection switches of the selected set of the word-lines of the second array are turned on and all of the other word-line selection switches for the second array are turned off;

performing a comparison of the first and second current levels; and based upon the comparison, determining whether the selected set of word-lines includes one or more defective word-lines.

2. The method of claim 1, wherein establishing a first current level includes mirroring the current drawn by the first array while all of the word-line selection switches thereof are turned off and determining the level of the mirrored current drawn by the first array, and wherein establishing a second current level includes mirroring the current drawn by the second array while the word-line selection switches of the selected set of the word-lines of the second array are turned on and all of the other word-line selection switches for the second array are turned off and determining the level of the mirrored current drawn by the second array.

3. The method of claim 1, wherein the first and second arrays are the same and the method further comprises:

subsequent to establishing the first current level and prior to the applying of the voltage to the second array, recording the value established for the first current level; and subsequent to establishing the second current level, recording the value established for the second current level, wherein the comparison is performed using the recorded values of the first and second current levels.

4. The method of claim 1, wherein the first and second arrays are different, the first and second currents are established concurrently, and the comparison is performed while the first and second currents are so established.

5. The method of claim 1, wherein establishing each of the first and second current levels includes adding an offset current to any leakage current respectively from the first and second arrays.

6. The method of claim 1, wherein the memory arrays are formed of a plurality of erase blocks and the selected set of word-lines are from a first erase block.

7. The method of claim 6, wherein the selected set of word-lines are the alternate word-lines of the first erase block.

8. The method of claim 6, further comprising:
in response to determining that the first erase block includes one or more defective word-lines, mapping out the first erase block.

9. The method of claim 1, wherein the voltage is a high voltage value is provided from a charge pump.

10. The method of claim 9, wherein the voltage is a programming voltage level.

11. The method of claim 1, wherein establishing the first and second current level includes applying the voltage level respectively to the first and second arrays and, after a delay, measuring the current level.

12. The method of claims 1, wherein the determining whether the selected set of word-lines includes one or more defective word-lines includes determining that the second current exceeds the first current by a predetermined amount.

13. The method of claim 1, wherein said method of determining whether one or more of the word-lines are defective is performed subsequent to the memory device being operated for a period of time.

14. The method of claim 13, where said method is performed as part of an erase sequence.

15. The method of claim 1, wherein the memory device is part of a memory system including a controller and wherein said method is performed prior to an erase operation in response to a command from the controller.

16. The method of claim 1, wherein said method of determining whether one or more of the word-lines are defective is performed under the control of a state machine on the memory circuit.

17. A memory device, including:
one or more arrays of memory cells formed along a plurality of word-lines;
a voltage generation circuit to provide a first voltage level to an output node;
decoding circuitry, whereby the first voltage level from the output node can be selectively applied to the word-lines, including a corresponding selection switch for each of the individual word-lines and circuitry for supplying the first voltage level to all of the word-line selection switches of a selected array; and
word-line defect detection circuitry, including:
current level detection circuitry connectable to the array to determine that amount of current drawn by a selected array when the first voltage is supplied to the word-line selection switches thereof, the word-line selection switches of a selected set of the word-lines of the selected array are turned on and all of the other word-line selection switches for the selected array are turned off;
comparison circuitry to perform a comparison the current drawn by a first selected when all of the word-line selection switches thereof are turned off and of a second selected array when the word-line select switches of a selected pattern of word-lines thereof are turned on; and
logic circuitry to determine, based on the comparison, whether one or more of the word-lines of the selected pattern are defective.

18. The memory device of claim 17, wherein the current level detection circuitry further includes:
a current mirror circuit connectable to the array and to the comparison circuitry to mirror the amount of current drawn by a selected array when the first voltage is supplied to the word-line selection switches thereof and supply the mirror current level to the comparison circuitry to perform said comparison.

19. The memory device of claim 18, wherein the voltage generation circuit includes voltage offsetting circuitry to compensate for the voltage drop across the current mirror circuit.

20. The memory device of claim 17, wherein the first and second selected arrays are the same array and the comparison circuitry further includes a plurality of registers and the word-line defect detection circuitry records therein the current drawn when all of the word-line selection switches thereof are turned off and the current level when the word-line select switches of a selected pattern of word-lines thereof are turned on, and wherein the comparison is performed using the stored values.

21. The memory device of claim 17, wherein the memory arrays are formed of a plurality of erase blocks and the selected patterns of word-lines are from a first erase block.

22. The memory device of claim 21, wherein the selected set of word-lines are the alternate word-lines of the first erase block.

23. The memory device of claim 17, wherein the word-line defect detection circuitry further includes a current source that adds an offset current to any leakage current to the values used for performing the comparison.

24. The memory device of claim 17, wherein the voltage generation circuit includes a charge pump circuit that generates the first voltage level.

* * * * *